(12) United States Patent
Fujita

(10) Patent No.: US 7,193,296 B2
(45) Date of Patent: Mar. 20, 2007

(54) SEMICONDUCTOR SUBSTRATE

(75) Inventor: Harumitsu Fujita, Hamamatsu (JP)

(73) Assignee: Yamaha Corporation (JP)

( * ) Notice: Subject to any disclaimer, the term of this patent is extended or adjusted under 35 U.S.C. 154(b) by 108 days.

(21) Appl. No.: 11/039,956

(22) Filed: Jan. 24, 2005

(65) Prior Publication Data
US 2005/0184362 A1     Aug. 25, 2005

(30) Foreign Application Priority Data
Jan. 26, 2004 (JP) .............................. 2004-017586

(51) Int. Cl.
| H01L 23/544 | (2006.01) |
| H01L 23/48 | (2006.01) |
| H01L 23/52 | (2006.01) |
| H01L 29/40 | (2006.01) |

(52) U.S. Cl. ...................... 257/620; 257/751; 257/758

(58) Field of Classification Search ................. 257/620, 257/750–758
See application file for complete search history.

(56) References Cited

U.S. PATENT DOCUMENTS 7,129,566 B2 * 10/2006 Uehling et al. ............. 257/620
2006/0082003 A1 * 4/2006 Shizuno ...................... 257/787

FOREIGN PATENT DOCUMENTS

| JP | 57-113241 | 7/1982 |
| JP | 59-014663 | 1/1984 |
| JP | 05-121793 | 5/1993 |
| JP | 07-037839 | 2/1995 |

* cited by examiner

Primary Examiner—Cuong Nguyen
(74) Attorney, Agent, or Firm—Dickstein, Shapiro, LLP.

(57) ABSTRACT

A semiconductor substrate is partitioned along scribing lines so as to form a plurality of IC regions encompassed by seal rings, wherein a passivation opening is formed in the scribing line in which a monitoring element is formed within a monitoring element region, which is encompassed by secondary seal rings, which are constituted by metal layers, oxidation layers and via holes. The secondary seal rings are formed to encompass the periphery of the monitoring element, which can thus precisely monitor characteristics of integrated circuits because it is possible to prevent water and impurities from infiltrating into the monitoring element region which is thus stabilized in characteristics.

8 Claims, 15 Drawing Sheets

SEMICONDUCTOR SUBSTRATE

BACKGROUND OF THE INVENTION

1. Field of the Invention

This invention relates to semiconductor substrates having monitoring elements, which are formed in scribing lines for the purpose of testing ICs.

This application claims priority on Japanese Patent Application No. 2004-17586, the content of which is incorporated herein by reference.

2. Description of the Related Art

Conventionally, semiconductor devices such as IC chips and LSI chips are manufactured using semiconductor wafers such as silicon wafers. In accordance with processes regarding thin film growth, photolithography, and etching, a plurality of integrated circuits (ICs) are formed on the same semiconductor wafer, which is subjected to cutting along scribing lines by use of dicing saws and the like so as to separate individual IC chips (or semiconductor chips), wherein semiconductor chip are each subjected to bonding with lead frames and are then subjected to resin molding.

Recently, a variety of electronic devices are manufactured and developed to realize highly-sophisticated functions, wherein they are reduced in sizes and dimensions realizing small thickness, whereby it is possible to produce composite semiconductor devices having multiple functions realizing functions of magnetic sensors, temperature sensors, and pressure sensors, which are put to practical uses. For example, composite semiconductor devices are accompanied with magnetic sensors, an example of which is disclosed in Japanese Patent Application Publication No. H05-121793, wherein IC chips are equipped with giant magnetoresistive effect elements (referred to as GMR elements).

FIG. 5 is a plan view showing a silicon wafer (or a semiconductor wafer) on which a plurality of semiconductor devices (i.e., semiconductor chips having magnetic sensors) are formed; FIG. 6 is an enlarged plan view showing a semiconductor device (i.e., a semiconductor chip having a magnetic sensor) and its periphery; and FIG. 7 is a cross-sectional view taken along line A—A in FIG. 6.

In FIG. 5, reference numeral 1 designates a silicon wafer in which scribing lines 3 are formed in a latticed manner on a silicon substrate (or a semiconductor substrate) so as to form a plurality of IC regions in a matrix manner, wherein the IC regions include IC components 4.

The IC components 4 each have a laminated structure in which wiring layers including electric circuits and insulating layers are alternately laminated together. Specifically, as shown in FIG. 6, the IC component 4 having a square shape includes an IC 5 implementing functions of various circuits such as an analog-to-digital converter (ADC), a memory (M), and an analog circuit (AnC), wherein GMR elements 6 to 9 are respectively arranged externally of and in proximity to prescribed sides (e.g., four sides in case of FIG. 6) of the IC 5 and are electrically connected with the IC 5. That is, a magnetic sensor is realized by the GMR elements 6 to 9.

Seal rings 11 are formed to encompass the IC component 4. Scribing lines 3, which are band-like regions having prescribed widths, are formed outside of the seal rings 11 in boundaries between adjacent IC regions. Channels 13 for separation of individual semiconductor chips are formed at the center of scribing lines 3.

FIG. 7 shows a cross-sectional structure with regard to the IC component 4, seal ring 11, and scribing line 3, wherein an integrated circuit (IC) implementing functions of an analog-to-digital converter (ADC), a memory (M), and an analog circuit (AnC) and an insulating layer 22 composed of silicon oxide are formed on a p-type silicon substrate (referred to as a p-Si substrate) 21; an insulating layer 23 is formed to cover the IC and the insulating layer 22 such the one end thereof extends to the seal ring 11; a wiring layer 24a having a prescribed wiring pattern, an insulating layer 25a, a wiring layer 24b having a prescribed wiring pattern, and an insulating layer 25b are sequentially formed and laminated together on the insulating layer 23. The three insulating layers 23, 25a, and 25b are arranged at vertically different positions, wherein the insulating layers 25a and 25b are each slanted and extend in the seal ring 11 in such a way that the insulating layer 25a covers the insulating layer 23, and the insulating layer 25b covers the insulating layer 25a.

The GMR elements 6 to 9 and a wiring layer 24c are formed on a planar surface of the insulating layer 25b, and a metal layer 26, which is formed in the same level of the wiring layer 24c, is formed in a slanted surface of the insulating layer 25b, which extends in the seal ring 11, in such a way that the lower end thereof is brought into contact with the p-type silicon substrate 21. In addition, a passivation film (or a protective insulating layer) 28 composed of silicon nitride is formed to cover the GMR elements 6–9, wiring layer 24c, and metal layer 26. The wiring layers 24a to 24c are electrically connected with each other by metals filled into via holes.

The passivation film 28 is subjected to patterning such that the lower end thereof is limited within the range of the seal ring 11, so that the exposed region of the p-type silicon substrate 21, which is not covered with the passivation film 28, is used for the scribing line 3.

FIG. 8 is a cross-sectional view showing a second example of a silicon wafer, wherein an IC component 31 is constituted such that a planar insulating layer 32 is formed to cover the GMR elements 6–9 and the wiring layer 24c as well as the upper end of the metal layer 26, and a passivation film 33 is formed to cover the planar insulating layer 32 and the metal layer 26.

FIG. 9 is a cross-sectional view showing a third example of a silicon wafer, wherein a seal ring 41 is subjected to patterning to realize a laminated structure comprising the insulating layer 23, a metal layer 42a that is formed in the same level of the wiring layer 24a, the insulating layer 25a, a metal layer 42b that is formed in the same level of the wiring layer 24b, the insulating layer 25b, and a metal layer 42c that is formed in the same level of the wiring layer 24c. The metal layers 42a, 42b, and 42c are electrically connected with each other by metals filled in via holes. In addition, a planar insulating layer 32 is formed to cover the GMR elements 6–9 and the wiring layer 24c as well as one end of the metal layer 42c; a passivation film 33 is formed to cover the planar insulating layer 32 and the upper portion of the metal layer 42c as well as the end portions of the insulating layers 23, 25a, and 25b, whereby the lower end of the passivation film 33 is limited within the range of the seal ring 41.

As described above, the semiconductor chip having the magnetic sensor is constituted in such a way that the magnetoresistive elements are incorporated into the IC; hence, it can cope with the recent tendencies of electronic devices that are reduced in sizes and dimensions realizing small thickness.

Chip regions corresponding to semiconductor chips having thin-film elements have multilayer structures in which wiring layers including electric circuits and insulating layers are laminated together with respect to the IC components 4 and 31 respectively. Thin-film elements such as magnetic sensors are generally formed using thin films in order to avoid deterioration of properties thereof, wherein passivation layers are formed on multilayer structures to realize planarity.

In the scribing line 3 partitioning chip regions, the surface of the p-type silicon substrate 21 is exposed so as to cause a relatively great height difference; hence, nonuniformity of resist application (i.e., striation) may occur in resist formation regions, which are used to form thin-film elements on the IC components 4 and 31. This causes unwanted deviations of shapes and dimensions of thin-film elements. In addition, there is a possibility that contaminating substances produced by thin-film elements may have adverse effects on the 'exposed' silicon-related portions of IC regions.

As disclosed in the aforementioned publication, semiconductor devices such as IC devices and LSI devices have been developed in such a way that thin-film elements such as magnetoresistive elements are formed on ICs via insulating layers, wherein uppermost wiring layers are connected with thin-film elements via openings formed therein.

FIG. 15 is a cross-sectional view showing an example of a semiconductor device accompanied with a thin-film element. That is, a semiconductor device 101 of FIG. 15 is manufactured in such a way that an insulating layer 102 composed of silicon oxide or silicon nitride is formed on the upper portion of an IC formed on a silicon substrate (not shown); and a wiring layer 103 having a prescribed pattern is formed on the insulating layer 102 and is electrically connected with the IC via a via hole (not shown) that is formed in the insulating layer 102.

An insulating layer 104 composed of silicon oxide is formed on the wiring layer 103; and an opening 105 is formed in the insulating layer 104 so as to expose the surface of the wiring layer 103. In addition, a thin-film element 107 is formed in association with the opening 105 of the insulating layer 104 via a wiring layer 106 therefor. Furthermore, an insulating film 108 composed of silicon nitride is formed to encompass peripheral ends of the thin-film element 107.

Next, a method for forming the opening 105 will be described. As shown in FIG. 16A, vacuum evaporation or sputtering is performed to form the wiring layer 103 having the prescribed pattern on the insulating layer 102; then, the CVD (i.e., Chemical Vapor Deposition) process is performed to form the insulating layer 104, which entirely covers the insulating layer 102 and the wiring layer 103. The spin-coating process is performed to apply a photoresist 109 onto the insulating layer 104. The photoresist 109 is exposed to ultraviolet radiation via a mask (not shown) and is then subjected to development; thus, it is possible to form an opening 109a whose pattern matches the pattern of the mask on the photoresist 109.

Then, plasma etching or reactive ion etching is performed on the insulating layer 104 by using the photoresist 109 as a mask so that the upper surface of the wiring layer 103 is exposed as shown in FIG. 16B, wherein an opening whose pattern matches the pattern of the opening 109a is formed in the insulating layer 104.

As shown in FIG. 16C, the photoresist 109 is removed, and vacuum evaporation or sputtering is performed to sequentially form films using a wiring material 11 and a thin-film element material 12 in association with the wiring layer 103 and the insulating layer 104.

Thereafter, patterning is performed on the wiring material 11 and the thin-film element material 12, thus forming the wiring 106 and the thin-film element 107 shown in FIG. 15.

An insulating film is further formed on the insulating layer 104 and the thin-film element 107 and is then subjected to patterning so as to form an insulating film 108 in connection with peripheral ends of the thin-film element 107.

In order to realize desired characteristics of thin-film elements, which are formed on ICs in semiconductor devices, it is preferable to reduce dimensions of thin-film elements and wiring layers therefor in thickness; and it is preferable for wiring layers of thin-film elements to have planar surfaces. Such 'thin' wiring layers are formed to lie across openings having cross-sectionally rectangular shapes on ICs. This causes problems in that wiring layers become very thin in proximity to edges of openings and are therefore easy to break compared with normal wiring layers formed in semiconductor devices.

The aforementioned problems may be solved by reducing height differences before the formation of thin-film elements, wherein insulating layers are covered with planar insulating layers. However, it may be difficult to eliminate height differences between ICs and thin-film elements in proximity edges of openings. That is, in the semiconductor device 101, the opening 105 has sharply rising walls in both sides thereof; hence, the wiring layer 106 may be easy to break in proximity to the opening 105. This reduces the reliability in manufacturing semiconductor devices.

The aforementioned drawback may be solved by forming the upper portion of the wall of the opening roughly in a semi-spherical shape or a tapered shape. This may reduce the possibility regarding breaks of the wiring layer; however, due to the sharpness of the lower portion of the wall of the opening, there remain possibilities in that the wiring layer may be easy to break in proximity to the opening and may be reduced in thickness inside of the opening, which causes reduction of the reliability in manufacturing semiconductor devices.

A plurality of ICs are simultaneously formed on the surface of a single semiconductor substrate (or a single semiconductor wafer), which is subjected to cutting using a dicing saw along scribing lines in the final step of manufacture, thus separating individual chips for semiconductor devices.

Various defects such as film defects and crystal defects, which occur in IC forming processes, are distributed on the surface of the semiconductor substrate so as to cause defectiveness in ICs; therefore, it is preferable to exclude such defective chips on the semiconductor substrate before cutting into chips through inspection. For this reason, monitoring elements are formed outside of chip regions so as to monitor characteristics of semiconductor elements and various values regarding processes of formation of semiconductor elements in progress, wherein characteristic inspection is performed using monitoring elements before the semiconductor substrate is cut into chips. This makes it possible to determine quality and defectiveness of IC chips before being installed in individual semiconductor devices. Normally, monitoring elements are formed on scribing lines, whereby after the completion of the characteristic inspection, they are destroyed by the dicing saw when the semiconductor substrate is subjected to scribing into chips.

Scribing lines are linear regions, which are formed between IC regions and each of which has a prescribed width allowing formation of a channel used for separation of chips. Various methods have been developed to form monitoring elements for testing by use of scribing lines. For example, Japanese Patent Application Publication No. S57-113241 discloses that monitoring elements for monitoring basic circuit characteristics or manufacturing parameters are formed on scribing lines or in the periphery of scribing lines.

Japanese Patent Application Publication No. S59-14663 discloses that in order to improve the detection precision of pressure defects due to crystal defects, monitoring elements are increased in areas and are formed along scribing lines.

FIG. 26 is a plan view showing the layout for arranging monitoring elements within scribing lines, wherein two scribing lines 202 are formed between four IC regions 201, which adjoin together, and a plurality of monitoring elements 203 having connection pads for use in characteristic measurement are formed in the scribing lines 202. Reference numeral 204 designates a passivation opening in which passivation layers are removed in order to facilitate dicing.

As described above, the monitoring elements 203 are formed using the scribing lines 202, which are vacant areas on the semiconductor substrate, wherein after the completion of formation of ICs, the semiconductor substrate is subjected to cutting along the scribing lines 202, thus separating IC chips.

Japanese Patent Application Publication No. H07-37839 discloses a semiconductor device that has a protection structure for encompassing the periphery of an IC by seal rings in order to prevent water or impurities, which cause characteristic defects, from infiltrating into cut surfaces when the semiconductor substrate is cut into chips.

FIG. 27 is a cross-sectional view showing a seal ring structure for protection of an IC, which is formed in an IC region 201. A plurality of IC regions 201 are formed on the surface of a silicon substrate 201 and are each constituted by integrated circuits and multilayer wiring, wherein the seal ring structure is formed in the periphery of the IC region in order to prevent water and impurities from infiltrating therein.

In the seal ring structure, a first interlayer insulating film 214, a first wiring layer 216, a second interlayer insulating film 218, a second wiring layer 220, and a passivation film 222 are sequentially formed to cover the end of a field oxidation film 212 and to encompass the IC region 201 formed on the surface of the silicon substrate 211. CVD oxidation films and SOG (Spin On Glass) films, which are formed by spin-coating of silica solution, are frequently used as the interlayer insulating films 214 and 218. In addition, silicon nitride films produced by plasma CVD are frequently used as the passivation film 222.

FIG. 28 is a plan view magnifying the periphery of a monitoring element 203 formed in a scribing line 202 at the boundary between adjacent IC regions 201, wherein seal rings 205 are formed to encompass the IC regions 201, whereas no seal ring is formed in the periphery of the monitoring element 203 formed in a monitoring element region 231 in the scribing line 202.

FIG. 29 is a cross-sectional view taken along line E-E' in FIG. 28. The uppermost surface of the scribing line 202 is covered with the 'solid' passivation film 222, which is partially removed in the passivation opening 204 in which an interlayer insulating film 215-2 such as a CVD oxidation film or a SOG film is partially exposed. The CVD oxidation film and SOG film have low ability to block water because they transmit water therethrough, so that they are insufficient to protect the monitoring element 203.

As described above, various measures for blocking water infiltration are normally adapted to the peripheries of ICs in IC chips; however, no measure for blocking water infiltration is adapted to monitoring elements. For this reason, in IC chips having monitoring elements, water infiltrating into passivation openings of scribing lines cause fixed charges in interlayer insulating films, which make characteristics of monitoring elements to be unstable. This makes it difficult for monitoring elements to achieve the purpose for precisely monitoring internal conditions of IC chips.

SUMMARY OF THE INVENTION

It is an object of the invention to provide a semiconductor substrate in which monitoring elements formed in scribing lines are encompassed by seal rings so as to block water and impurities from infiltrating into ICs, thus stabilizing characteristics of monitoring elements.

According to the invention, a semiconductor substrate is partitioned along scribing lines so as to form a plurality of IC regions encompassed by seal rings, wherein a passivation opening is formed in the scribing line in which a monitoring element is formed within a monitoring element region, which is encompassed by secondary seal rings. The secondary seal rings are specifically formed to encompass the periphery of the monitoring element, which can thus precisely monitor characteristics of integrated circuits because it is possible to prevent water and other impurities from infiltrating into the monitoring element region, which is thus stabilized in characteristics.

In the above, the secondary seal rings are each connected with a silicon substrate, whereby it is possible to stabilize well potential and to improve the precision of monitoring. In addition, a part of the secondary seal rings share the same functions of the seal rings used for the formation of the IC regions, whereby it is possible to effectively use the area used for the formation of the scribing line, which can be thus reduced in width. Furthermore, a part of the secondary seal ring, which lies between the monitoring element region and the passivation opening in the scribing line, is removed, whereby it is possible to easily estimate the diffusion velocity of water into interlayer insulating layers in the monitoring element region. It is preferable that the width of the seal ring be greater than the width of the secondary seal ring.

Moreover, the seal ring has a laminated structure having a plurality of metal layers, which are laminated together via an insulating layer and are mutually connected together via a contact hole. In addition, the secondary seal ring has a laminated structure having a plurality of metal layers, which are laminated together via an insulating layer and are mutually insulated from each other by way of a via hole. Thus, it is possible to secure the long-term guarantee of reliability with respect to the seal ring used for the formation of the IC region; it is possible to reduce the overall area used for the formation of the secondary seal ring; and it is possible to improve the yield of production of chips per one substrate.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
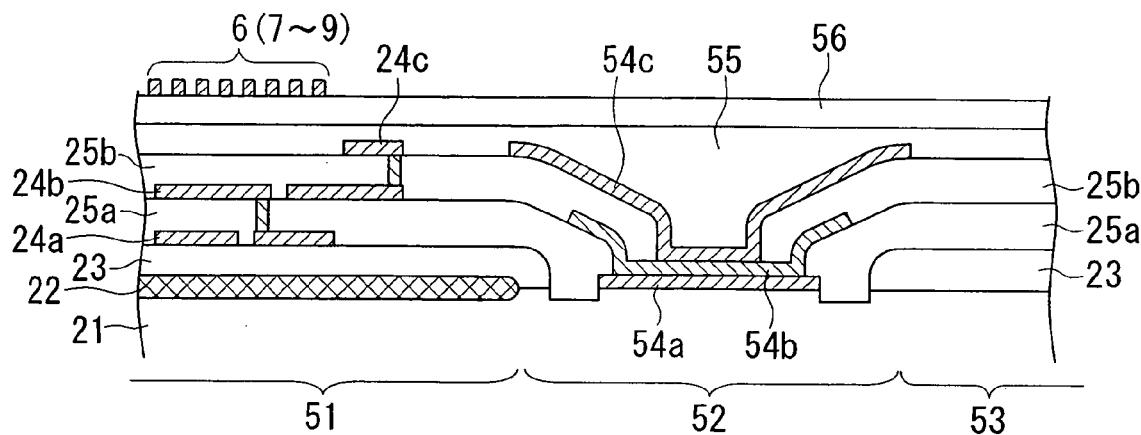
FIG. 1 is a cross-sectional view showing essential parts of a silicon wafer in accordance with a first embodiment of the invention.
Figure 7:
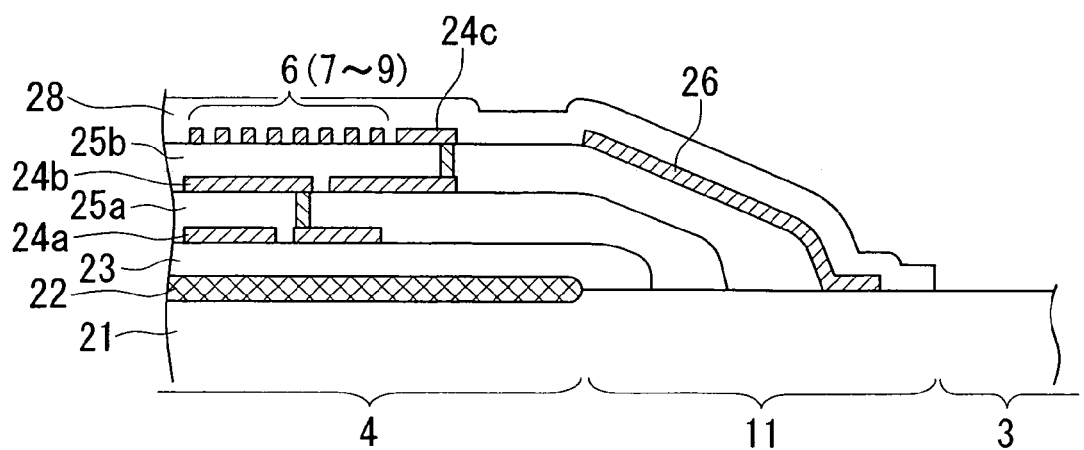
FIG. 7 is a cross-sectional view taken along line A—A in FIG. 6.
Figure 8:
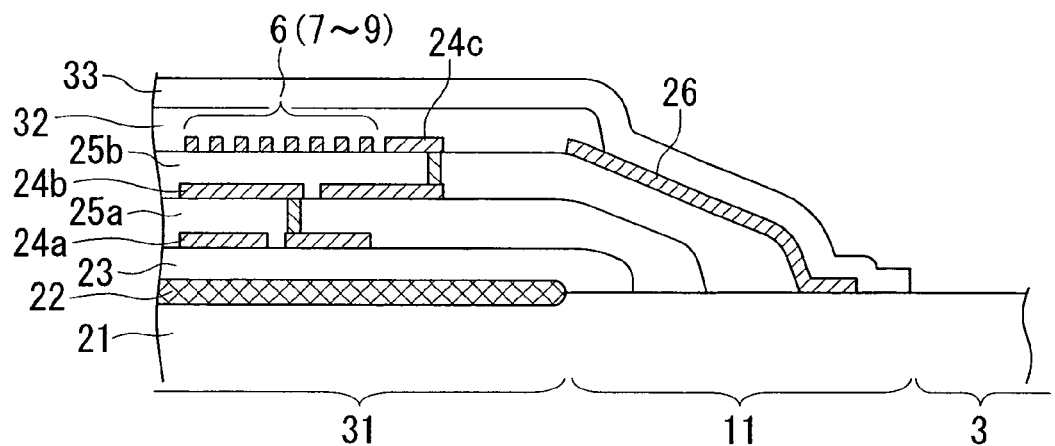
FIG. 8 is a cross-sectional view showing a second example of the silicon wafer.
Figure 9:
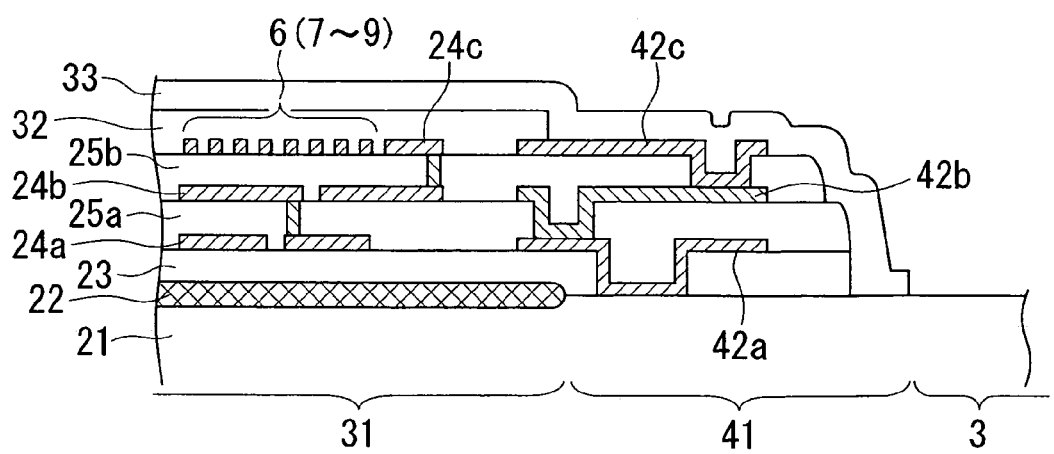
FIG. 9 is a cross-sectional view showing a third example of the silicon wafer.

FIG. 1 is a cross-sectional view showing essential parts of a silicon wafer (or a semiconductor wafer) in which a plurality of semiconductor devices (i.e., semiconductor chips having magnetic sensors) are formed in accordance with a first embodiment of the invention, wherein parts identical to those shown in FIG. 7 are designated by the same reference numerals.

In FIG. 1, reference numeral 51 designates an IC that is formed in an IC region of the p-type silicon substrate 21; reference numeral 52 designates a seal ring that is formed in the periphery of the IC 51; and reference numeral 53 designates a scribing line (or a scribing region) that is formed outside of the seal ring 52 in the boundary between adjacent IC regions.

An insulating layer 23 composed of silicon dioxide ($SiO_2$) is formed to cover the IC 51 and the scribing line 53 on the p-type silicon substrate 21; a wiring layer 24a having a prescribed wiring pattern composed of prescribed metals such as gold (Au) and aluminum (Al) is formed on the insulating layer 23; a metal layer 54a composed of the same materials of the wiring layer 24a is formed to cover the center portion of the seal ring 52; and an insulating layer 25a composed of $SiO_2$ is formed to cover both ends of the metal layer 54a in connection with the insulating layer 23 and the wiring layer 24a.

In addition, a wiring layer 24b having a prescribed wiring pattern composed of prescribed metals such as Au and Al is formed on the insulating layer 25a; a metal layer 54b composed of the same materials of the wiring layer 24b is formed such that the lower portion thereof comes in contact with the metal layer 54a; an insulating layer 25b is formed to cover the wiring layer 24b and the insulating layer 25a as well as the both ends of the metal layer 54b; GMR elements 6–9 and a wiring layer 24c are formed above the planar surface of the 'uppermost' insulating layer 25b; and a metal layer 54c composed of the same material of the 'uppermost' wiring layer 24c is formed to cover the center portion of the seal ring 52 such that the lower portion thereof comes in contact with the metal layer 54b.

Furthermore, a planar insulating layer 55 composed of $SiO_2$ is formed to cover the wiring layer 24c and the metal layer 54c; a passivation film (or a protective insulating layer) 56 composed of silicon nitride (i.e., $Si_3N_4$) is formed on the planar insulating layer 55; and the GMR elements 6–9 are formed on the passivation film 56.

As described above, the planar insulating layer 55 is arranged to cover all of the IC 51, seal ring 52, and scribing line 53 and is formed to have a planar surface, by which it is possible to eliminate the height difference between the IC 51 and the scribing line 53. This eliminates the nonuniformity of resist application even when a resist is applied onto the IC 51 in order to realize the further formation of thin-film elements; and it is possible to improve the precision of dimensions in the formation of thin-film elements further formed on the IC 51.

Next, a method of manufacturing a silicon wafer will be described in detail.

In accordance with the normal thin-film formation process, the insulating layer 23, wiring layer 24a, metal layer 54a, insulating layer 25a, wiring layer 24b, metal layer 54b, insulating layer 25b, GMR elements 6–9, wiring layer 24c, and metal layer 54c are sequentially formed on the p-type silicon substrate 21.

In accordance with the SOG (i.e., Spin On Glass) method, a liquid mainly composed of perhydropolysilazane is applied onto the wiring layer 24c and the metal layer 54c; then, the semiconductor chip is left alone for a prescribed time so as to realize leveling, thus forming a planar film. The planar film applied to the semiconductor chip is subjected to burning at 450° C. or so in the atmospheric air so as to form the planar insulating layer 55 composed of high-purity $SiO_2$. The surface of the planar insulating layer 55 has a superior degree of planarity.

In accordance with the chemical vapor deposition (CVD) method, the passivation film 56 composed of $Si_3N_4$ is formed to cover the planar insulating layer 55.

In the plasma CVD method, for example, a prescribed material such as $SiH_4$—$NH_3(N_2)$ or $SiH_4$—$N_2O$ is used to realize film formation at a film growth temperature of about 300° C.

Next, the GMR elements 6–9 are formed on the passivation film 56.

Thereafter, a second protective insulating layer (not shown) is formed to cover the GMR elements 6–9.

In the aforementioned manufacturing method, the planar insulating layer 55 is formed to entirely cover the wiring layer 24c and the metal layer 54c; thus, it is possible to eliminate the height difference between the IC 51 and the scribing line 53. This facilitates the production of a silicon wafer having no height difference between the IC 51 and the scribing line 53.

In addition, the aforementioned liquid mainly composed of perhydropolysilazane is applied onto the wiring layer 24c and the metal layer 54c; then, the semiconductor chip is subjected to burning at 450° C. or so in the atmospheric air, thus forming the planar insulating layer 55 composed of high-purity $SiO_2$. Thus, it is possible to produce the planar insulating layer 55 whose surface has a superior degree of planarity.

According to the silicon wafer of the present embodiment, the planar insulating layer 55 having the planar surface is formed to entirely cover the IC 51, seal ring 52, and scribing line 53, whereby it is possible to eliminate the height difference between the IC 51 and the scribing line 53. This reduces the nonuniformity of resist application even when a resist is applied to the IC 51 in order to realize the further formation of thin-film elements; therefore, it is possible to improve the precision of dimensions in the formation of thin-film elements on the IC 51.

According to the manufacturing method of the silicon wafer of the present embodiment, the planar insulating layer 55 is formed to entirely cover the IC 51, seal ring 52, and scribing line 53; therefore, it is possible to produce the silicon wafer having no height difference between the IC 51 and the scribing line 53.

In addition, the liquid mainly composed of perhydropolysilazane is applied onto the IC 51, seal ring 52, and scribing line 53; then, the semiconductor chip is subjected to burning at 450° C. or so in the atmospheric air so as to form the planar insulating layer 55 composed of high-purity $SiO_2$, whereby it is possible to easily produce the planar insulating layer 55 whose surface has a superior degree of planarity.

Next, modified examples of the present embodiment will be described in detail.

A first modified example will be described with regard to the manufacturing method of a silicon wafer with reference to FIG. 1.

In accordance with the normal thin-film formation process, the insulating layer 23, wiring layer 24a, metal layer 54a, insulating layer 25a, wiring layer 24b, metal layer 54b, insulating layer 25b, wiring layer 24c, and metal layer 54c are sequentially formed on the p-type silicon substrate 21.

In accordance with the CVD method, a prescribed material of $SiH_4$—$O_2$ is processed to form the planar insulating layer 55 composed of $SiO_2$, which covers the wiring layer 24c and the metal layer 54c.

Irregularities are formed on the surface of the planar insulating layer 55 in correspondence with projections and hollows formed on the insulating layer 25b, wiring layer 24c, and metal layer 54c. Chemical mechanical polishing (CMP) is performed on the entire surface of the planar insulating layer 55, which is thus made completely planar.

The CMP is performed in such a way that a silicon wafer (which is a polished subject) is arranged on a polishing head; slurry, in which fine particles composed of $SiO_2$ and cerium oxide ($CeO_2$) are dispersed in alkaline solution such as potassium hydroxide (KOH) and aqueous ammonia ($NH_4OH$), is subjected to dripping onto a polishing pad that is equipped with a fraise; the silicon wafer is rotated at a prescribed angular velocity under a prescribed pressure, so that it revolves on the fraise rotating at a different angular velocity.

Thus, it is possible to polish the surface of the planar insulating layer 55, which thus has a high degree of optical planarity on the order of nanometers.

In accordance with the CVD method, the passivation film 56 composed of $Si_3N_4$ is formed to cover the planar insulating layer 55. In the plasma CVD process, for example, a prescribed material of $SiH_4$—$NH_3(N_2)$ or $SiH_4$—$N_2O$ is used for the film formation at a film growth temperature of 300° C..

As described above, it is possible to produce the silicon wafer in which no height difference is formed between the IC 51 and the scribing line 53.

According to the aforementioned manufacturing method, the planar insulating layer 55 is formed to cover the IC 51, seal ring 52, and scribing line 53; then, the surface of the planar insulating layer 55 is subjected to planation; hence, it is possible to easily produce the silicon wafer having no height difference between the IC 51 and the scribing line 53.

The CMP is performed to polish the entire surface of the planar insulating layer 55, whereby it is possible to easily process the planar insulating layer 55 to have a high degree of optical planarity on the order of nanometers. This makes it easy to produce the silicon wafer having no height difference between the IC 51 and the scribing line 53.

Instead of the CMP performed on the entire surface of the planar insulating layer 55, it is possible to perform the CMP on the surface of the passivation film 56. In this case, it is possible to easily produce the silicon wafer having no height difference between the IC 51 and the scribing line 53.

Figure 2:
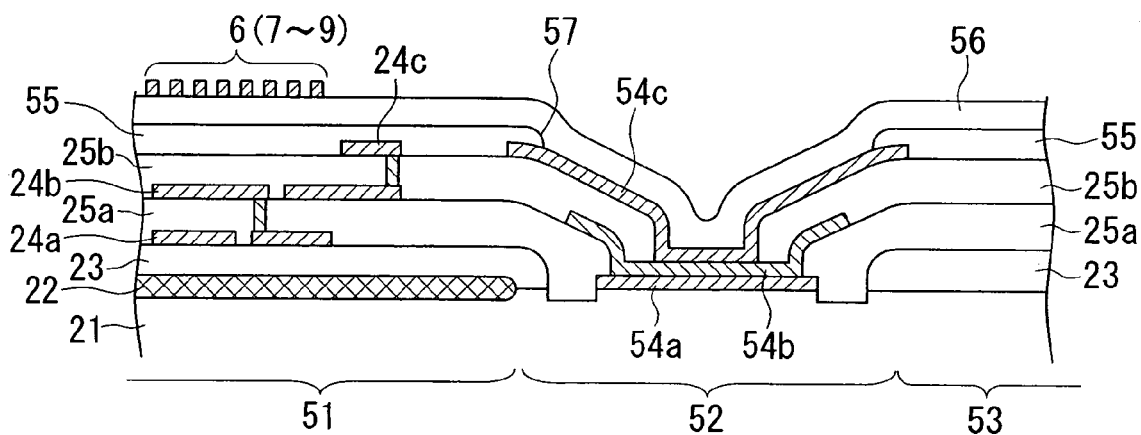
FIG. 2 is a cross-sectional view showing essential parts of a silicon wafer in accordance with a second modified example of the first embodiment of the invention.

Next, a second modified example will be described with reference to FIG. 2, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 is formed to entirely cover the metal layer 54c, and the passivation film 56 is formed on the entire surface of the planar insulating layer 55, the silicon wafer of FIG. 2 is characterized in that dry etching is performed to selectively remove a prescribed region of the planar insulating layer 55 above the metal layer 54c so as to form a window 57, by which a cavity is exposed in correspondence with the scribing region of the metal layer 54c, so that the passivation film 56 is formed to cover the 'remaining' planar insulating layer 55 and the 'exposed' metal layer 54c.

A manufacturing method of the silicon wafer of FIG. 2 will be described in detail.

In accordance with the aforementioned steps used in the present embodiment (see FIG. 1), the planar insulating layer 55 is formed to entirely cover the metal layer 54c. Then, dry etching is performed to selectively remove a prescribed region of the planar insulating layer 55 above the metal layer 54c, thus exposing the cavity in correspondence with the scribing region of the metal layer 54c. Thereafter, the plasma CVD method is performed to form the passivation film 56 to cover the planar insulating layer 55 and the exposed metal layer 54c. Thus, it is possible to produce the silicon wafer of FIG. 2 having no height difference between the IC 51 and the scribing line 53.

According to the second modified example of the silicon wafer in which the planar insulating layer 55 entirely covers the IC 51 and the scribing line 53, it is possible to eliminate the height difference between the IC 51 and the scribing line 53.

In addition, the second modified example is characterized in that dry etching is performed to selectively remove a prescribed region of the planar insulating layer 55 above the metal layer 54c, and the passivation film 56 is formed to directly cover the exposed metal layer 54c. This causes the seal ring 52 to partially break the planar insulating layer 55, which may act as the water infiltration path; hence, it is possible to prevent water from infiltrating into the IC 51.

Furthermore, according to the manufacturing method of the silicon wafer of the second modified example, the planar insulating layer 55 is subjected to etching so as to expose the cavity in correspondence with the scribing region of the metal layer 54c, wherein the passivation film 56 is formed to cover the exposed metal layer 54c. Thus, it is possible to easily produce the silicon wafer having no height difference between the IC 51 and the scribing line 53, which also eliminates the possibility that water will infiltrate into the IC 51.

Next, a third modified example will be described with reference to FIG. 3, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 is formed to entirely cover the metal layer 54c, and the passivation film 56 is formed on the entire surface of the planar insulating layer 55, the silicon wafer of FIG. 3 is characterized in that dry etching is performed to selectively remove a prescribed region of the planar insulating layer 55 above the relatively planar portion of the metal layer 54c so as to form a window 58, by which the relatively planar portion of the metal layer 54c is exposed; then, the passivation film 56 is formed to cover the planar insulating layer 55 and the exposed portion of the metal layer 54c.

In the above, the relatively planar portion of the metal layer 54c corresponds to the boundary between the scribing region and the IC region with respect to the metal layer 54c, wherein the metal layer 54 is partially made planar.

Figure 3:
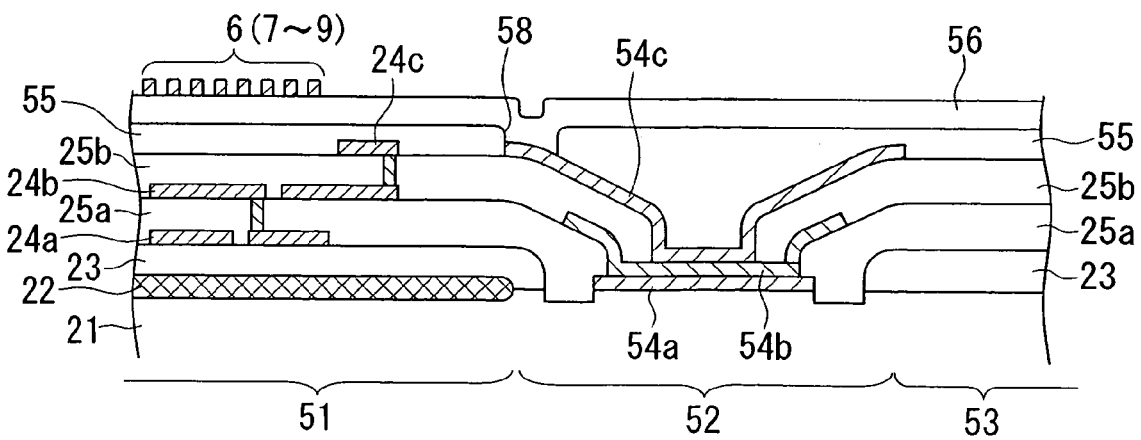
FIG. 3 is a cross-sectional view showing essential parts of a silicon wafer in accordance with a third modified example of the first embodiment of the invention.

In the silicon wafer of FIG. 3, the planar insulating layer 55 entirely covers the IC 51; it covers most of the seal ring 52; and it entirely covers the scribing line 53; hence, it is possible to extremely reduce the height difference between the IC 51 and the seal ring 52.

In addition, etching is performed to selectively remove the prescribed region of the planar insulating layer 55 above the relatively planar portion of the metal layer 54c, and the passivation film 56 is formed to directly cover the exposed portion of the metal layer 54c. This causes the seal ring 52 to partially break the planar insulating layer 55, which may act as the water infiltration path; hence, it is possible to prevent water from infiltrating into the IC 51.

Next, a fourth modified example will be described with reference to FIG. 4, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 entirely covers the metal layer 54c, and the passivation film 56 is formed on the entire surface of the planar insulating layer 55, the silicon wafer of FIG. 4 is characterized in that dry etching is performed on the planar insulating layer 55 in its certain depth so as to expose the surface of the metal layer 54c, which is made identical in level to the surface of the planar insulating layer 55, and the passivation film 56 is formed on the entirely planar surface so as to cover the remaining portion of the planar insulating layer 55 and the metal layer 54c.

Figure 4:
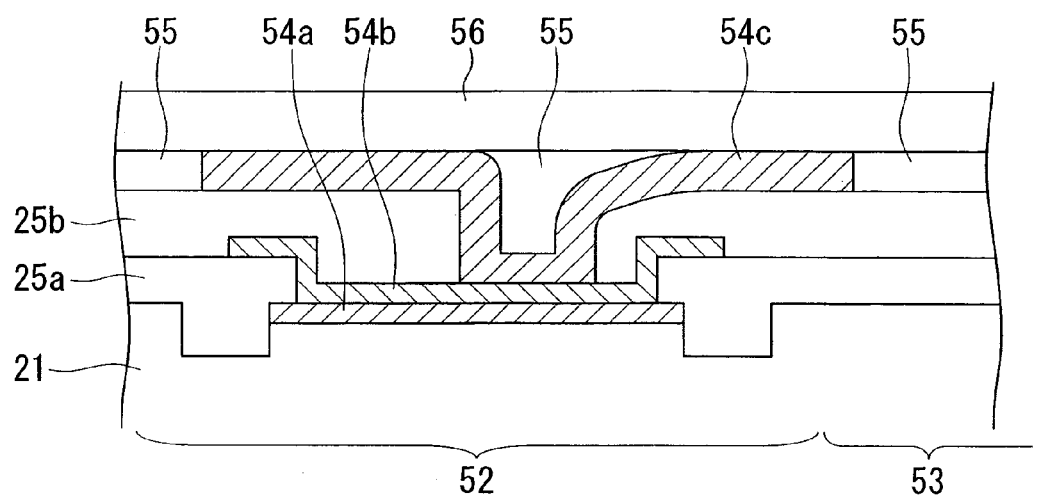
FIG. 4 is a cross-sectional view showing essential parts of a silicon wafer in accordance with a fourth modified example of the first embodiment of the invention.
Figure 5:
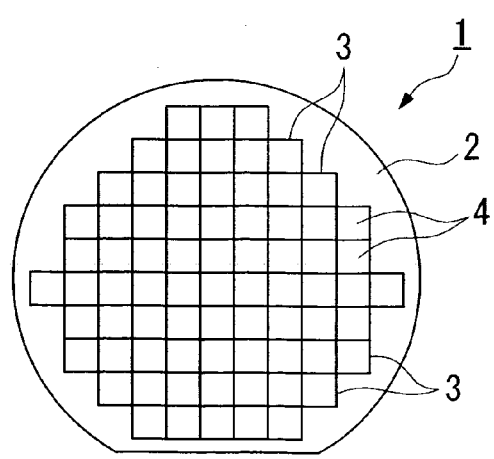
FIG. 5 is a plan view showing an example of a silicon wafer.
Figure 6:
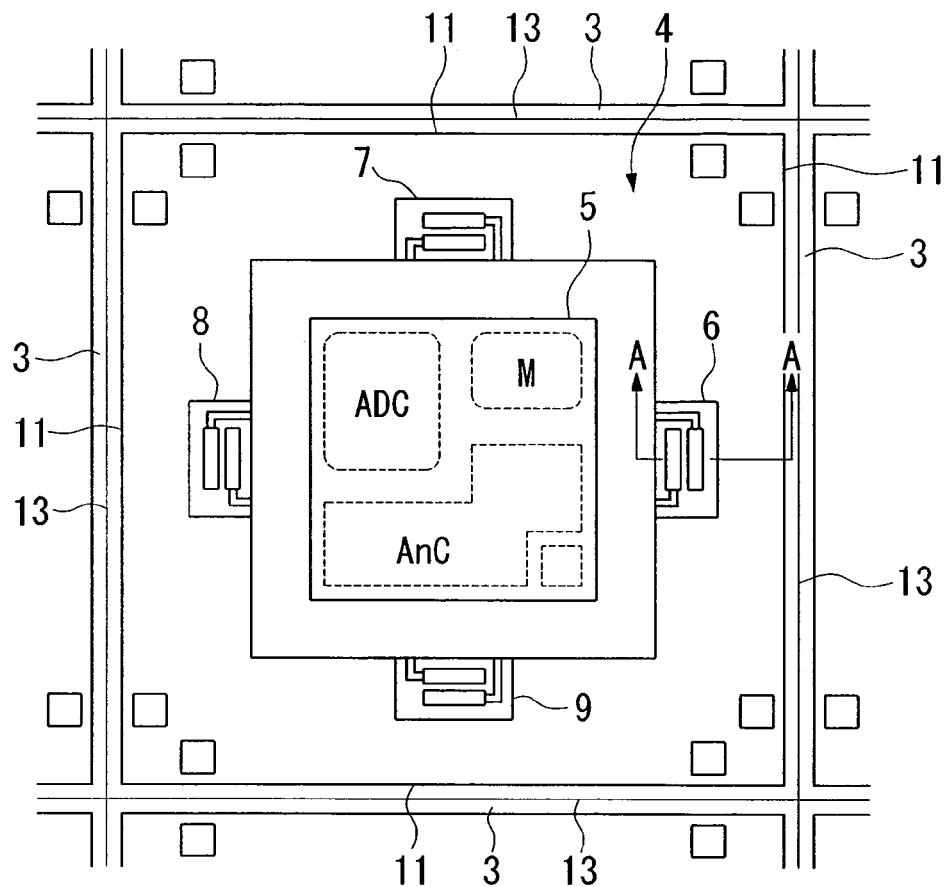
FIG. 6 is an enlarged plan view showing a semiconductor chip having a magnetic sensor and its periphery.

In the silicon wafer of FIG. 4, the planar insulating layer 55 entirely covers the IC 51, seal ring 52, and scribing line 53; hence, it is possible to eliminate the height difference between the IC 51 and the seal ring 52.

This causes the seal ring 52 to partially break the planar insulating layer 55, which may act as the water infiltration path, by the metal layer 54c; hence, it is possible to prevent water from infiltrating into the IC 51.

2. Second Embodiment

Figure 10:
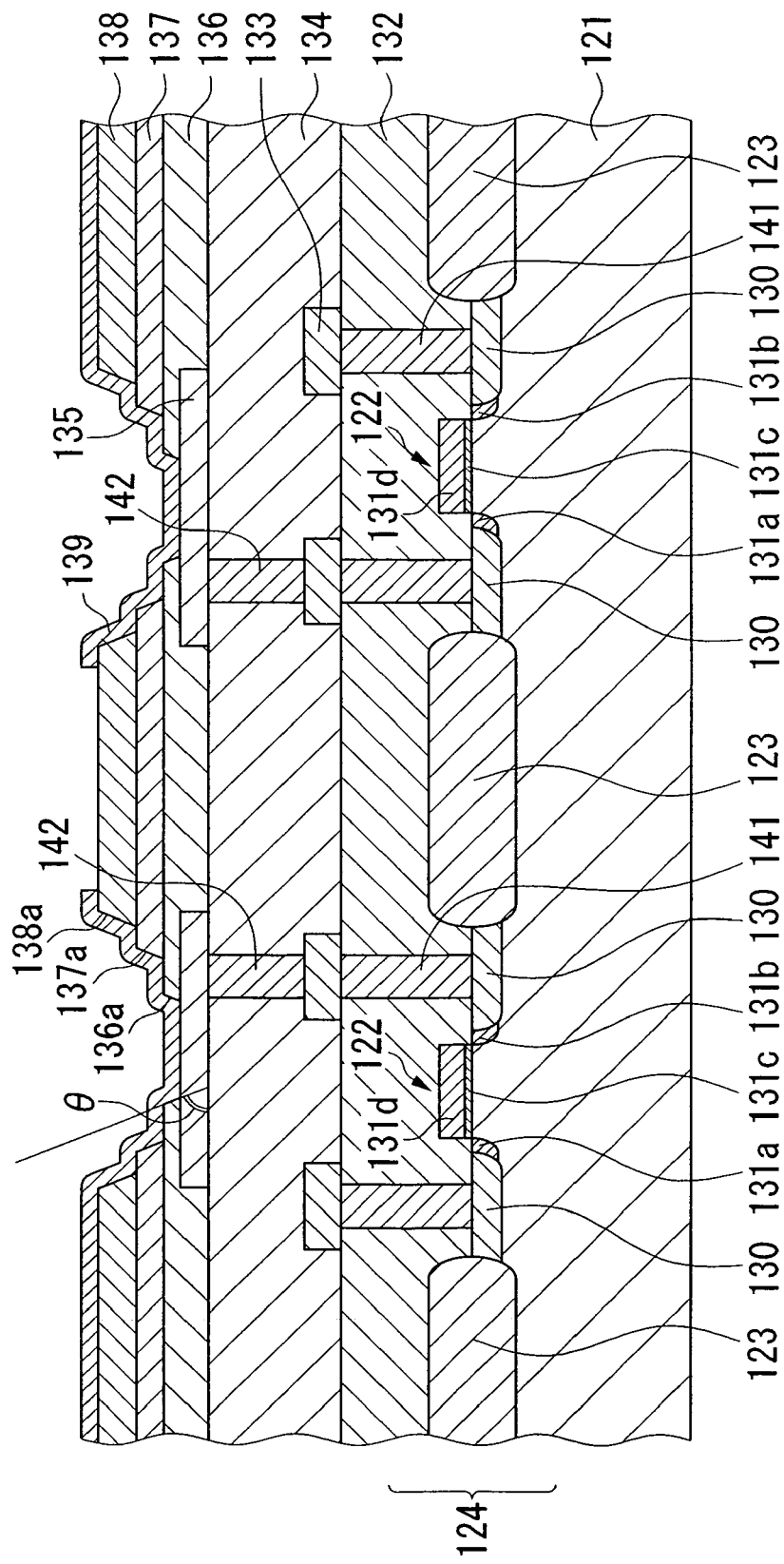
FIG. 10 is a cross-sectional view showing essential parts of a semiconductor device having thin-film elements in accordance with a second embodiment of the invention.

FIG. 10 is a cross-sectional view showing essential parts of a semiconductor device having thin-film elements in accordance with a second embodiment of the invention, wherein reference numeral 121 designates a p-type silicon substrate (or a semiconductor substrate); reference numerals 122 designate transistors formed on the silicon substrate; and reference numerals 123 designate field insulating films composed of silicon oxide, which are formed between the transistors 122. Herein, an IC region 124 includes the transistors 122, field insulating films 123, and peripheral circuits and other elements (not shown), which are formed on the silicon substrate 121.

The transistors 122 are each constituted by sources 131a and drains 131b, which are formed at upper ends of n+ embedded layers 130 formed on the silicon substrate 121, and gates 131d that are formed above the sources 131a and drains 131b via $SiO_2$ films (or insulating films) 131c.

On the IC region 124, there are sequentially formed an insulating layer 132 composed of silicon oxide, a first wiring layer 133 having a prescribed pattern composed of Al, Ti, TiN, W, and Cu, an insulating layer 134 composed of silicon oxide that covers the insulating layer 132 and the first wiring layer 133, and a second wiring layer 135 having a prescribed pattern composed of Al, Ti, TiN, W, and Cu, as well as insulating layers 136, 137, and 138 composed of silicon oxide, silicon nitride, or lamination of silicon oxide and silicon nitride, which are laminated together so as to cover the insulating layer 134 and the second wiring layer 135. In addition, contacts 141, composed of Al, Ti, TiN, W, and Cu, for establishing electric connections between the n+embedded layer 130 and the first wiring layer 133 are embedded in the insulating layer 132. Furthermore, vias 142, composed of Al, Ti, TiN, W, and Cu, for establishing electric connections between the first wiring layer 133 and the second wiring layer 135 are embedded in the insulating layer 134.

Openings 136a, 137a, and 138a are respectively formed in the insulating layers 136, 137, and 138 so as to partially expose the upper surface of the second wiring layer 135. The wall of the opening 136a is slanted in such a way that the opened area of the opening 136a is gradually expanded from the bottom to the upper end, wherein the slanted wall of the opening 136a has a slanted angle θ that ranges from 20° to 80° against the bottom of the insulating layer 136.

The opened area of the opening 137a is expanded to form a step-like portion above the opening 136a, wherein the wall of the opening 137a is slanted in such a way that the opened area is gradually expanded from the bottom to the upper end, and wherein the slanted angle of the slanted wall of the opening 137a ranges from 20° to 80° against the bottom of the insulating layer 137.

Similarly, the opened area of the opening 138a is expanded to form a step-like portion above the openings 136a and 137a, wherein the wall of the opening 138a is slanted in such a way that the opened area is gradually expanded from the bottom to the upper end, and wherein the slanted angle of the slanted wall of the opening 138a ranges from 20° to 80° against the bottom of the insulating layer 138.

A wiring layer 139 for establishing electric connection between a thin-film element (not shown), which is formed on the insulating layer 138, and the second wiring layer 135 is formed on the walls of the opening 136a to 138a and the upper surface of the second wiring layer 135.

In the semiconductor device having the thin-film element described above, the walls of the openings 136a to 138a, which expose the upper surface of the second wiring layer 135, are formed in a step-like manner and are each slanted against the bottoms of the insulating layers 136 to 138 by prescribed slanted angles ranging from 20° to 80°. This increases the thickness of the wiring layer 139 that are formed on the walls of the openings 136a to 138a; hence, it is possible to reliably prevent the wiring layer 139 for the thin-film element from being broken. In addition, it is possible to avoid the occurrence of initial characteristic failure such as open failure due to failure of the wiring layer 139; hence, it is possible to improve the reliability of semiconductor devices having thin-film elements.

Next, a method for forming the openings 136a to 138a will be described in detail.

As shown in FIG. 1A, the insulating layer 136 is formed to entirely cover the insulating layer 134 and the second wiring layer 135; a resist film 151 is formed on the insulating layer 136; then, the resist film 151 is subjected to patterning using a mask, thus forming an opening 151a at a prescribed position of the resist film 151.

The resist film 151 is exposed to light whose wavelength ranges from 100 nm to 500 nm, preferably, from 140 nm to 450 nm, for a prescribed time period ranging from 100 msec to 2000 msec; then, the semiconductor device is subjected to heating using a heating device (e.g., a hot plate or an oven) at a prescribed temperature ranging from 120° C. to 200° C. for a prescribed time ranging from 1 min to 60 min.

Figure 11A:
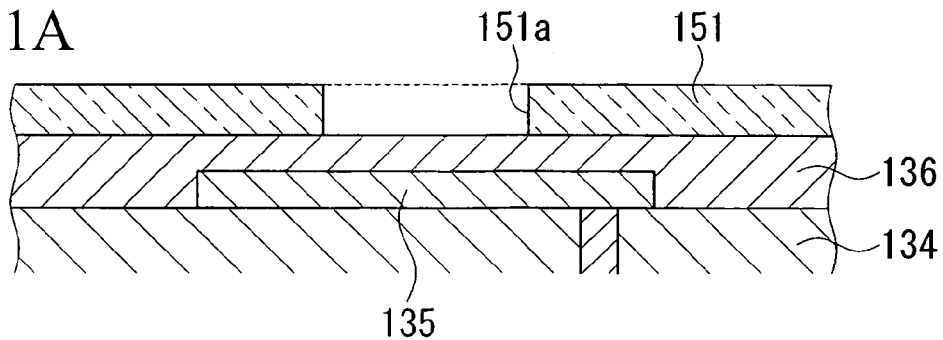
FIG. 11A is a cross-sectional view showing a first step for manufacturing the semiconductor device shown in FIG. 10.
Figure 11B:
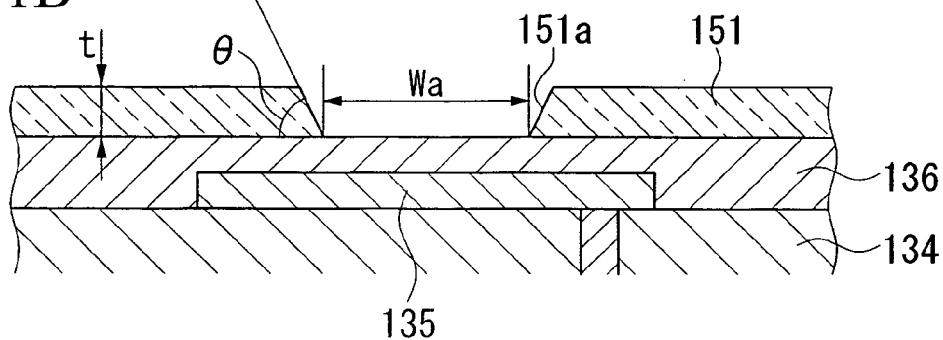
FIG 11B is a cross-sectional view showing a second step for manufacturing the semiconductor device shown in FIG. 10.

Thus, it is possible to produce the resist film 151 as shown in FIG 11B, in which thickness t ranges from 500 nm to 3000 nm; width Wa of the opening 151a ranges from 1 mn to 100 nm, preferably from 10 nm to 50 nm, and optimally 20 nm; slanted angle θ of the wall of the opening 151a ranges from 20 to 80° against the bottom of the resist film 151.

Figure 11C:
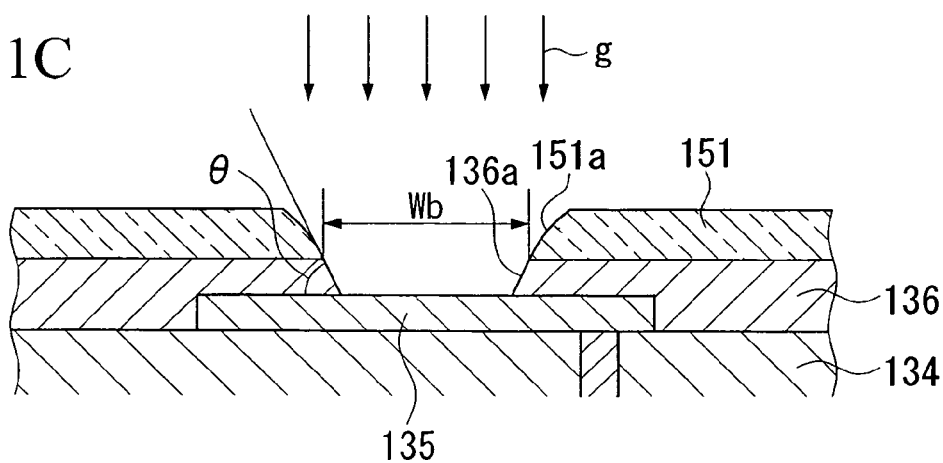
FIG. 11C is a cross-sectional view showing a third step for manufacturing the semiconductor device shown in FIG. 10.

As shown in FIG. 11C, etching is performed on the insulating layer 136 using the resist film 151 as a mask, wherein the insulating layer 136 is exposed to etching gas (or selective removal gas) g including freon gas and oxygen gas.

Specifically, the etching gas g is realized as mixed gas having a prescribed composition including $CF_4$ ranging from 20 sccm to 80 sccm, $CHF_3$ ranging from 60 sccm to 200 sccm, and $O_2$ ranging from 80 sccm to 120 sccm.

Preferably, the mixed gas has a composition including $CF_4$ of 60 sccm, $CHF_3$ of 180 sccm, and $O_2$ of 100 sccm or a composition including $CF_4$ of 30 sccm, $CHF_3$ of 180 sccm, and $O_2$ of 100 sccm.

In the above, the wall of the opening 151a of the resist film 151 is slanted so that when the etching gas g is sprayed from the upper position of the resist film 151 to the insulating layer 136, it causes erosion of the resist in the periphery of the opening 151a, which is thus gradually expanded in width from Wa to Wb. That is, the opening 151a of the resist film 151 is expanded by etching, whereby the opened area of the opening 136a is gradually expanded as the opening 151a of the resist film 151, which is reduced in dimensions. As a result, the wall of the opening 136a is slanted by the slanted angle θ ranging from 20° to 80° against the bottom of the insulating layer 136.

Figure 11D:
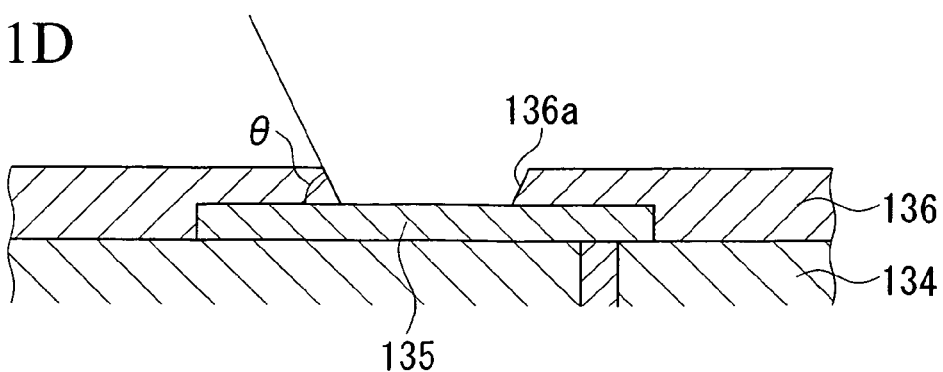
FIG. 11D is a cross-sectional view showing a fourth step for manufacturing the semiconductor device shown in FIG. 10.

Thereafter, the resist film 151 is completely removed. Thus, as shown in FIG. 11D, it is possible to form the insulating layer 136 having the opening 136a whose wall is slanted by the slanted angle θ ranging from 20° to 80° against the bottom of the insulating layer 136.

By repeating the aforementioned steps, it is possible to sequentially form the insulating layer 137 having the opening 137a and the insulating layer 138 having the opening 138a above the insulating layer 136 having the opening 136a. Herein, it is necessary to use different masks (realized by resist films) matching dimensions of the openings 137a and 138a respectively.

As described above, the semiconductor device having thin-film elements according to the present embodiment is characterized in that the walls of the openings 136a to 138a, by which the upper surface of the second wiring layer 135 is exposed, are formed in a step-like manner and are each slanted by the slanted angle ranging from 20° to 80° against the bottoms of the insulating layers 136 to 138 respectively. This increase the thickness of the wiring layer 139 formed on the walls of the openings 136a to 138a; hence, it is possible to prevent the wiring layer 139 from being broken, and it is possible to avoid the occurrence of the initial characteristic failure such as the open failure due to the failure of the wiring layer 139. Therefore, it is possible to improve the reliability of wiring regarding thin-film elements in semiconductor devices, which are thus improved in reliability.

According to the manufacturing method as shown in FIGS. 11A to 11D, etching is performed on the insulating layer 136 by use of a mask corresponding to the resist film 151 having the opening 151a whose wall is slanted by the slanted angle θ ranging from 20° to 80° against the bottom of the insulating layer 136; hence, it is possible to easily process the insulating layer 136 to have the opening 136a whose wall is slanted by the slanted angle θ ranging from 20° to 80° against the bottom of the insulating layer 136.

Thus, it is possible to prevent the wiring layer 139 for the thin-film element from being broken; and it is possible to easily produce semiconductor devices having thin-film elements that is improved in reliability in terms of wiring.

Next, a modified example of the second embodiment will be described in detail.

Figure 12:
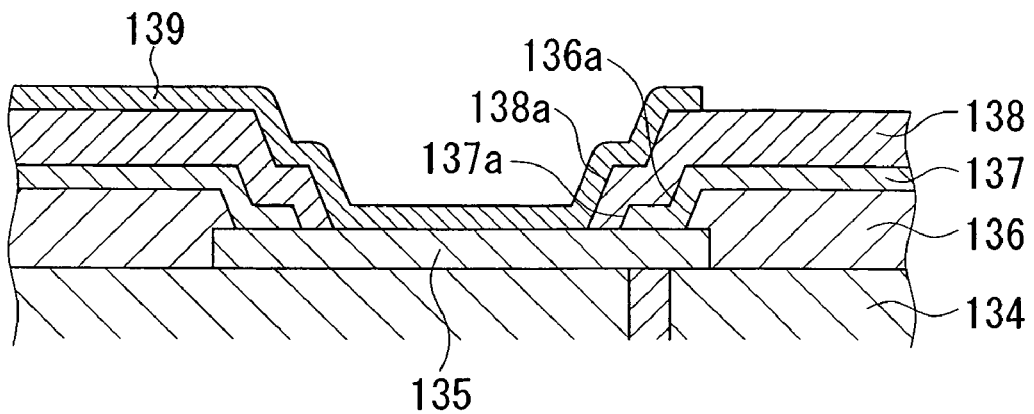
FIG. 12 is a cross-sectional view showing essential parts of a semiconductor device in accordance with a first modified example of the second embodiment of the invention.

FIG. 12 is a cross-sectional view showing essential parts of a semiconductor device in accordance with a first modified example of the second embodiment of the invention. Compared with the semiconductor device of the second embodiment shown in FIG. 10 in which the openings 136a to 138a are gradually expanded outwardly in a step-like manner in such a way that the opening 137a of the intermediate insulating layer 137 is opened outside of the opening 136a of the lowermost insulating layer 136, and the opening 138a of the uppermost insulating layer 138 is opened outside of the opening 137a of the intermediate insulating layer 137, the semiconductor device of FIG. 12 is characterized in that the openings 136a to 138a are inwardly reduced in a step-like manner in which the opening 137a of the intermediate insulating layer 137 is opened inside of the opening 136a of the lowermost insulating layer 136, and the opening 138a of the uppermost insulating layer 138 is opened inside of the opening 137a of the intermediate insulating layer 137.

The aforementioned openings 136a to 138a shown in FIG. 12 can be formed in accordance with steps similar to the foregoing steps for forming the openings 136a to 138a shown in FIG. 10. Herein, it is necessary to use masks having patterns realizing the openings 136a, 137a, and 138a shown in FIG. 12.

According to the first modified example shown in FIG. 12, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

Figure 13:
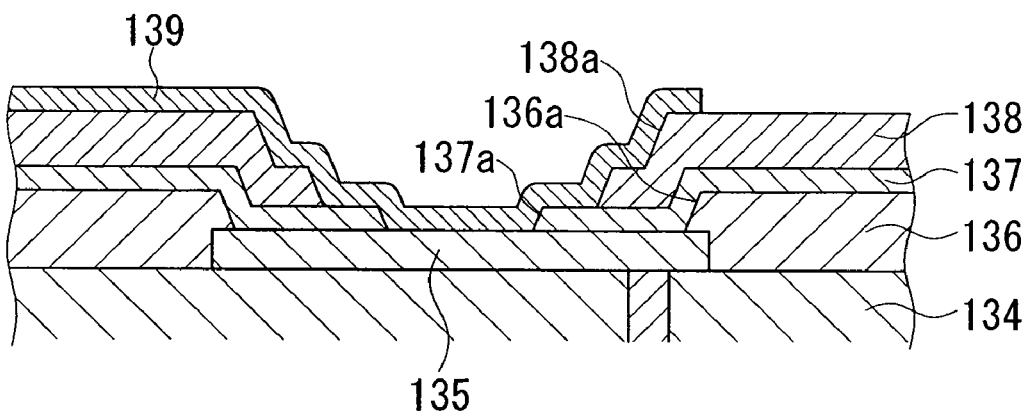
FIG. 13 is a cross-sectional view showing essential parts of a semiconductor device in accordance with a second modified example of the second embodiment of the invention.

FIG. 13 is a cross-sectional view showing essential elements of a semiconductor element having a thin-film element in accordance with a second modified example of the second embodiment of the invention. Compared with the semiconductor device of FIG. 10 in which the openings 136a to 138a are expanded outwardly in a step-like manner in which the opening 137a of the intermediate insulating layer 137 is opened outside of the opening 136a of the lowermost insulating layer 136, and the opening 138a of the uppermost insulating layer 138 is opened outside of the opening 137a of the intermediate insulating layer 137, the semiconductor device of FIG. 13 is characterized in that the opening 137a of the intermediate insulating layer 137 is opened inwardly of the opening 136a of the lowermost insulating layer 136, and the opening 138a of the uppermost insulating layer 138 is opened outwardly of the opening 137a of the intermediate insulating layer 137 and is inwardly of the opening 136a of the lowermost insulating layer 136.

The aforementioned openings 136a to 138a shown in FIG. 13 can be formed in steps similar to the foregoing steps for forming the openings 136a to 138a shown in FIG. 10. Herein, it is necessary to use masks having patterns realizing the openings 136a, 137a, and 138a shown in FIG. 13.

According to the second modified example shown in FIG. 13, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

Figure 14:
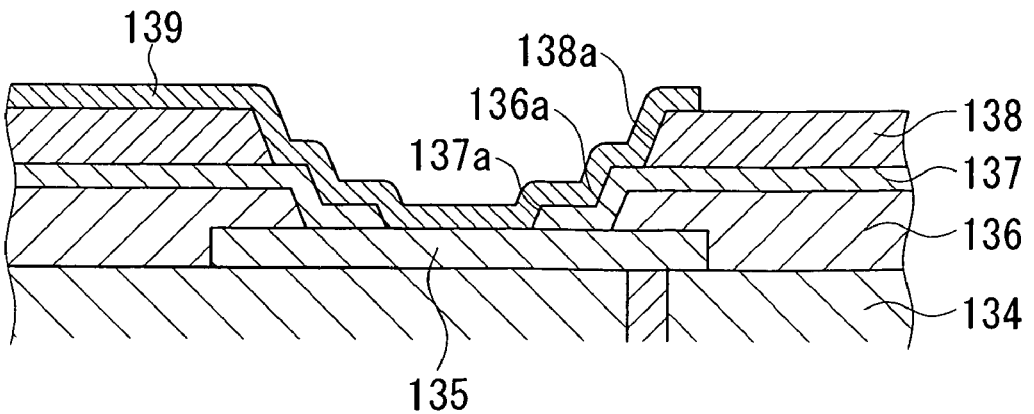
FIG. 14 is a cross-sectional view showing essential parts of a semiconductor device in accordance with a third modified example of the second embodiment of the invention.
Figure 15:
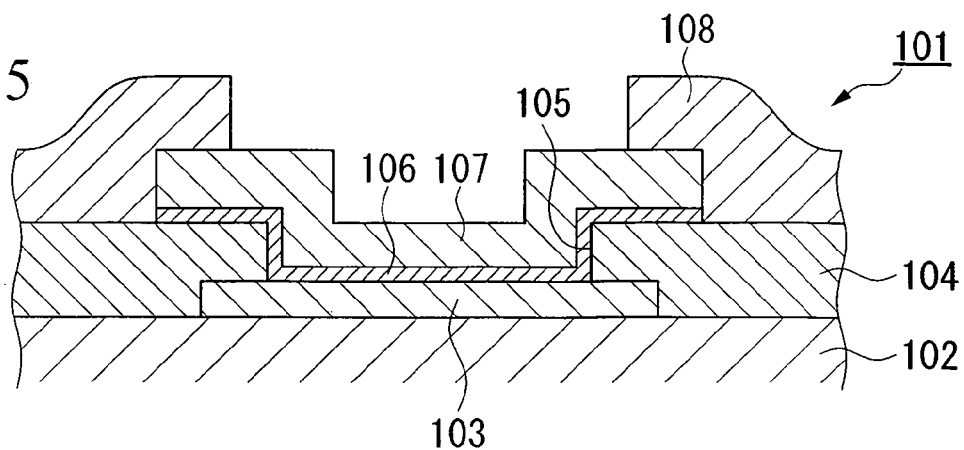
FIG. 15 is a cross-sectional view showing an example of a semiconductor device having a thin-film element.
Figure 16A:
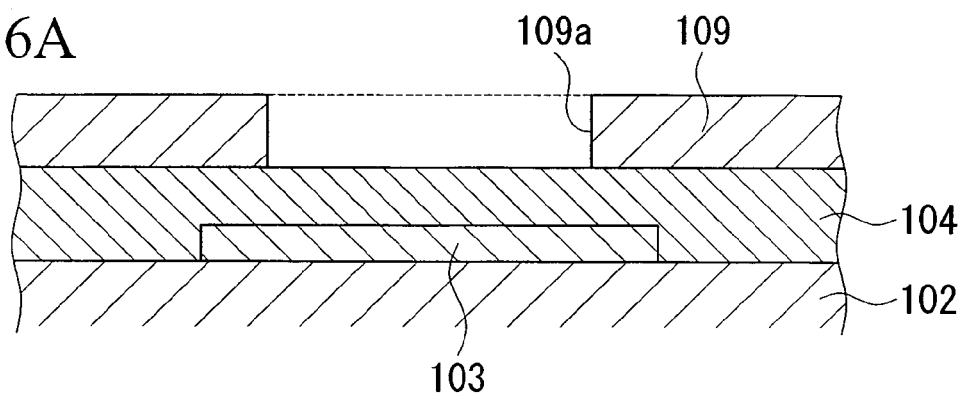
FIG. 16A is a cross-sectional view showing a first step for manufacturing the semiconductor device shown in FIG. 15.
Figure 16B:
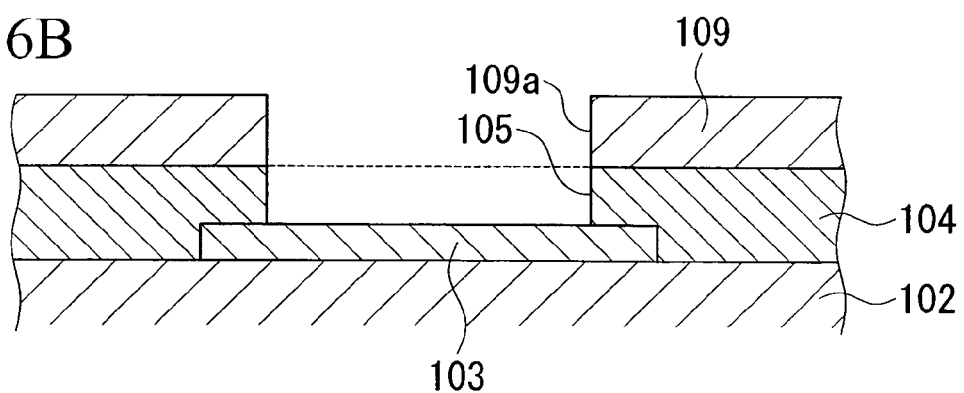
FIG. 16B is a cross-sectional view showing a second step for manufacturing the semiconductor device shown in FIG. 15.
Figure 16C:
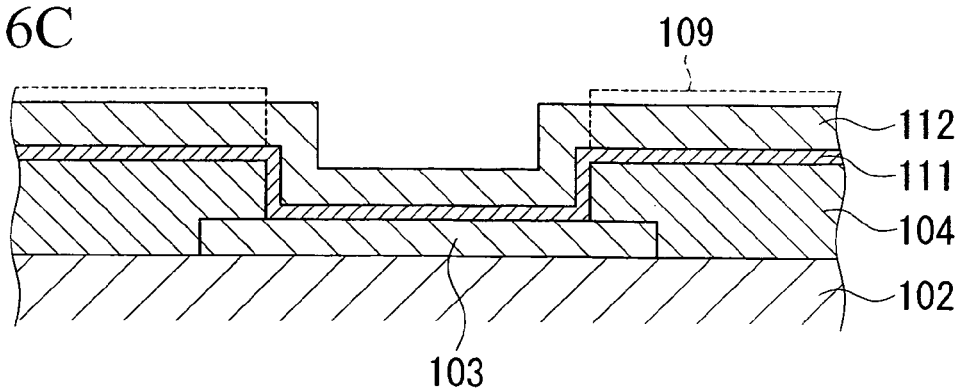
FIG. 16C is a cross-sectional view showing a third step for manufacturing the semiconductor device shown in FIG. 15.

FIG. 14 is a cross-sectional view showing essential parts of a semiconductor device in accordance with a third modified example of the second embodiment of the invention. Compared with the semiconductor device of FIG. 10 in which the openings 136a to 138a are expanded outwardly in a step-like manner in which the opening 137a of the intermediate insulating layer 137 is opened outside of the opening 136a of the lowermost insulating layer 136, and the opening 138a of the uppermost insulating layer 138 is opened outside of the opening 137a of the intermediate insulating layer 137, the semiconductor device of FIG. 14 is characterized in that the opening 137a of the intermediate insulating layer 137 is opened inwardly of the opening 136a of the lowermost insulating layer 136, and the opening 138a of the uppermost insulating layer 138 is opened inwardly of the opening 137a of the intermediate insulating layer 137 and the opening 136a of the lowermost insulating layer 136 respectively.

The aforementioned openings 136a to 138a shown in FIG. 14 can be formed in steps similar to the foregoing steps for forming the openings 136a to 138a shown in FIG. 10. Herein, it is necessary to use masks having patterns realizing the openings 136a, 137a, and 138a shown in FIG. 14.

According to the third modified example shown in FIG. 14, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

3. Third Embodiment

Figure 17:
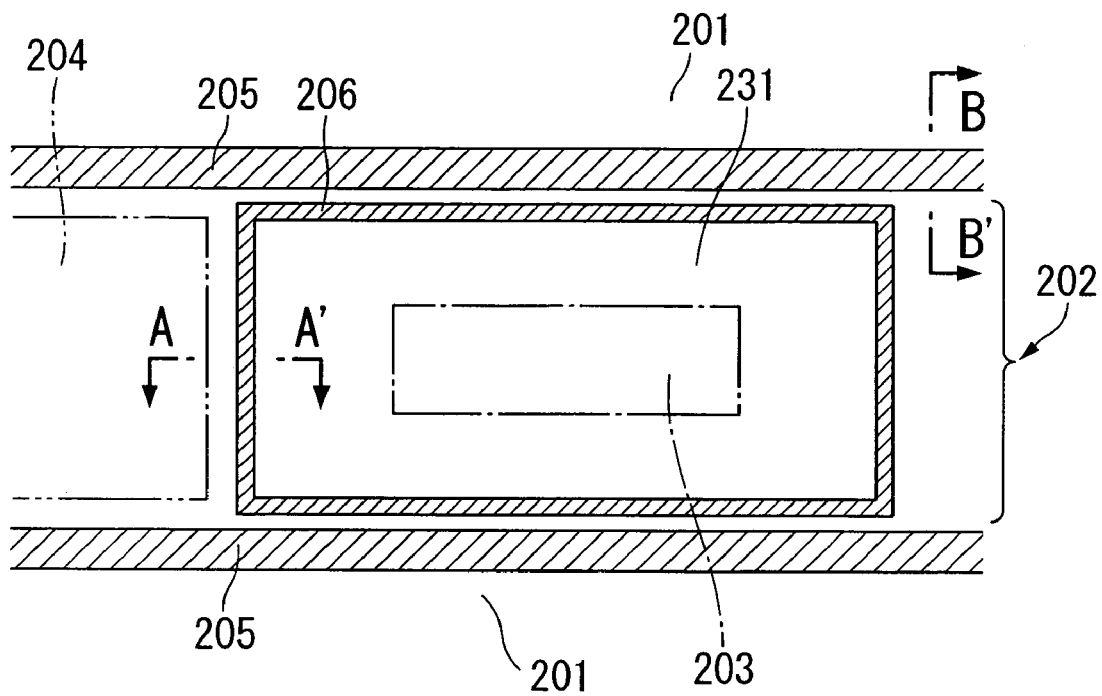
FIG. 17 is a plan view showing the layout of a monitoring element, seal rings, and IC regions formed on a semiconductor substrate in accordance with a third embodiment of the invention.
Figure 18:
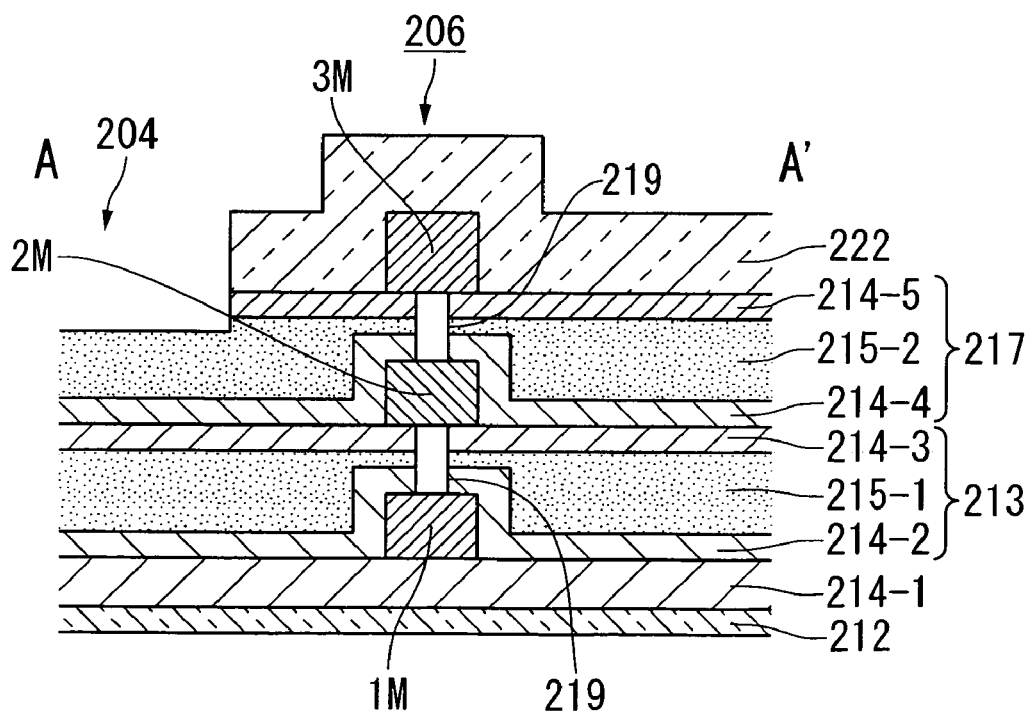
FIG. 18 is a cross-sectional view taken along line A–A' in FIG. 17, which shows essential parts in relation to a secondary seal ring used for the protection of the monitoring element.
Figure 19:
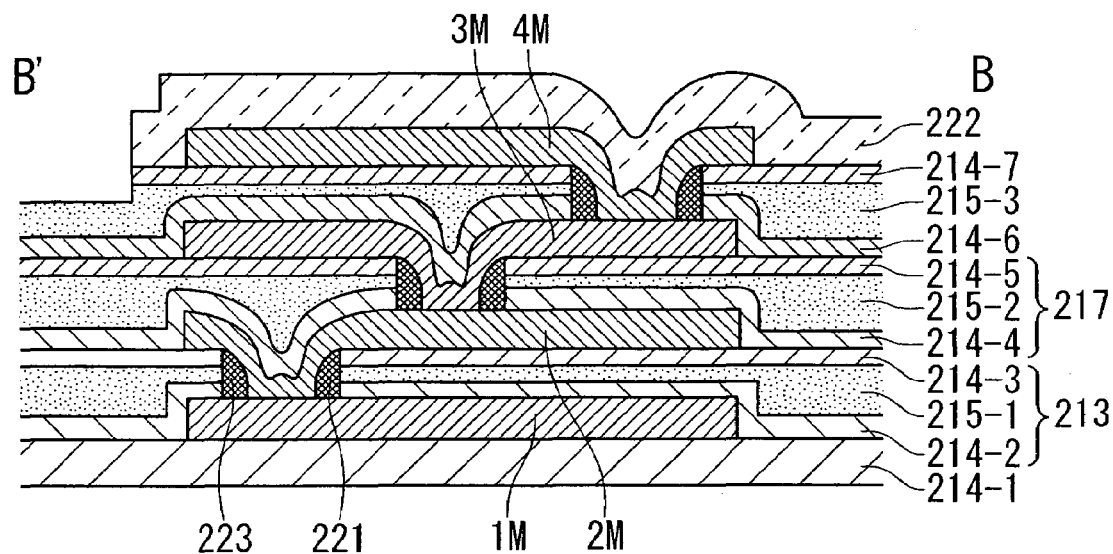
FIG. 19 is a cross-sectional view taken along line B–B' in FIG. 17, which shows essential parts in relation to a seal ring used for the formation of the IC region.

A semiconductor substrate having monitoring elements will be described in accordance with a third embodiment of the invention with reference to FIGS. 17 to 19, wherein parts identical to those shown in FIGS. 26 to 29 are designated by the same reference numerals, and wherein for the sake of simplicity and explanation, FIGS. 17 to 19 are not accurately illustrated in scale.

FIG. 19 is a plan view showing the periphery of a monitoring element 203 formed in a scribing line 202 that is formed between seal rings 205, which encompass IC regions 201 (not specifically illustrated). Numerous IC regions 201 are formed in a matrix form on the semiconductor substrate (not shown), wherein FIG. 19 shows essential parts for the explanation of seal rings used for the protection of the monitoring element 203.

On the left side of FIG. 19, a passivation opening 204 is formed by removing the solid passivation film that may disturb dicing. On the right side of FIG. 19, a monitoring element region 231 is formed and is encompassed by secondary seal rings 206 used for the protection of the monitoring element 203. The monitoring element 203 is formed in the monitoring element region 231. In the present embodiment, the secondary seal rings 206 used for the protection of the monitoring element 203 are formed in the periphery of the monitoring element region 231 and are reduced in widths compared with widths of the aforementioned seal rings 205 used for the formation of the IC regions 201.

FIG. 18 is a cross-sectional view taken along line A–A' in FIG. 17, which shows essential parts in relation to the secondary seal ring 206. The secondary seal ring 206 used for the protection of the monitoring element 203 is constituted by three metal layers 1M, 2M, and 3M sandwiching interlayer insulating films 215-1 and 125-2 therebetween. Via holes 219 are continuously formed between the metal layers 1M–3M in relation to interlayer insulating films so as to produce a pattern for encompassing the monitoring element 203 in plan view, whereby it is possible to partially break the interlayer insulating films. Specifically, a field oxidation film 212 is formed on a silicon substrate (not shown); a CVD oxidation film serving as a first interlayer insulating film 214-1 is formed on the field oxidation film 212; and the first metal layer 1M is formed on the CVD oxidation film. A second interlayer insulating film 213 constituted by a CVD oxidation film 214-2, an SOG film 215-1, and a CVD oxidation film 214-3 is formed on the metal layer 1M. A third interlayer insulating film 217 constituted by a CVD oxidation film 214-4, an SOG film 215-2, and a CVD oxidation film 214-5 is formed on the second metal layer 2M, which is formed on the second interlayer insulating film 213. In addition, a passivation film 222 is formed on the uppermost surface of the third metal layer 3M, which is formed on the CVD oxidation film 214-5. That is, the secondary seal ring 206 having the aforementioned cross-sectional structure is formed in the periphery of the monitoring element region 231.

As described above, the secondary seal ring 206 used for the protection of the monitoring element 203 provides the via holes 219 in relation to the interlayer insulating films 213 and 217 each constituted by three layers, i.e., the CVD oxidation film, SOG film, and CVD oxidation film, whereby it is possible to partially break the interlayer insulating films 213 and 217. The secondary seal ring 206 having the aforementioned cross-sectional structure is formed to encompass the monitoring element region 231. The secondary seal ring 206 is characterized in that in each of the interlayer insulating films 213 and 217, the SOG film, which may be weak in water infiltration, is partially broken; hence, it is possible to reliably block water from infiltrating into the monitoring element 203. The secondary seal ring 206 is designed such that three metal layers 1M–3M are vertically arranged in connection with the via holes 219; hence, it is possible to reduce the width of the secondary seal ring 206 compared with the aforementioned seal ring 205, details of which are shown in FIG. 19.

FIG. 19 is a cross-sectional view taken along line B–B' in FIG. 17, which shows essential parts in relation to the seal ring 205 used for the formation of the IC region 201. Herein, the seal ring 205 is adapted to the IC region 201 having four wiring layers, i.e., metal layers 1M, 2M, 3M, and 4M. Specifically, a CVD oxidation film 214-1 serving as a first interlayer insulating film is formed on a field oxidation film (not shown); a first metal layer 1M is formed on the first interlayer insulating film; a second interlayer insulating film 213 constituted by a CVD oxidation film 214-2, an SOC film 215-1, and a CVD oxidation film 214-3 is formed on the first metal layer 1M; and a third interlayer insulating film 217 constituted by a CVD oxidation film 214-4, an SOG film 215-2, and a CVD oxidation film 214-5 is formed on the second interlayer insulating film 213 via the second metal layer 2M. The first metal layer 1M and the second metal layer 2M is directly connected together via a contact hole 223, in which a side wall 221 is formed to secure the connection between the metal layers 1M and 2M. Similarly, the third metal layer 3M and the fourth metal layer 4M, details of which are omitted, are formed above the third interlayer insulating film 217. In addition, a passivation film 222 is formed on the uppermost surface. The aforementioned seal ring 205 requires a satisfactory width securing the long-term guarantee of reliability. In contrast, the monitoring element 203 merely requires a short-term protection by the secondary seal ring 206. Compared with the seal ring 205, it is sufficient for the secondary seal ring 206 to be formed by minor wiring rules with respect to sizes of via holes 219 and widths of metal layers 1M–3M, for example. Thus, it is possible to reduce the overall area occupied by the seal rings 206.

Next, the outline of the manufacturing method for the semiconductor substrate will be described, wherein ICs are formed by the conventionally known method, which is thus omitted in order to avoid complication of explanation. Hereinafter, a description will be given mainly with respect to the formation of a secondary seal ring used for the protection of a monitoring element.

The secondary seal ring is formed simultaneously together with the corresponding monitoring element, electrodes, wiring, insulating films, and other necessary parts.

In the case of a p-type substrate, for example, p-type impurity-doped regions (i.e., p wells) are formed for the preparation of the formation of elements on the surface of a silicon substrate. Then, a field oxidation film is formed for the separation of elements. A gate electrode for the formation of a monitoring element is formed on the field oxidation film. An element having a lightly doped drain (LDD) structure is formed so as to define a SD region. A CVD oxidation film is formed as a first interlayer insulating film on the overall surface of the substrate. A contact hole is formed in the CVD oxidation film.

Next, a first metal layer is formed in a seal ring region of a scribing line. A second interlayer insulating film is formed by sequentially laminating three layers, i.e., a CVD oxidation film, an SOG film, and a CVD oxidation film. The second interlayer insulating film is subjected to etching so as to form a first via hole, by which the second interlayer insulating film is partially broken.

Similarly, a second metal layer, a third interlayer insulating film, a second via hole, and a third metal layer are sequentially formed. Lastly, a 'solid' passivation film (e.g., a silicon nitride film) is formed on the overall area of a monitoring element region, in which a monitoring element is formed.

Next, modified examples of the third embodiment of the invention will be described with reference to FIGS. 20 to 25.

Figure 20:
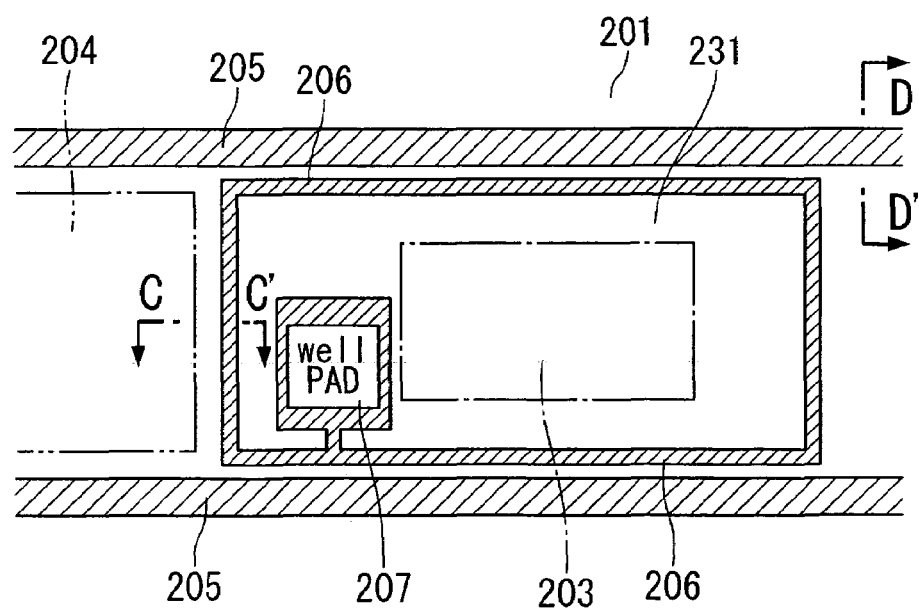
FIG. 20 is a plan view showing the layout for arranging a monitoring element in a scribing line on the surface of a semiconductor substrate in accordance with a first modified example of the third embodiment of the invention.

FIG. 20 is a plan view showing the layout for arranging a monitoring element in a scribing line on the surface of a semiconductor substrate in accordance with a first modified example of the third embodiment of the invention.

Compared with the semiconductor substrate shown in FIG. 17, the semiconductor substrate shown in FIG. 20 is characterized in that a secondary sealing ring 206 used for the protection of a monitoring element 203 is connected with a well region of a silicon substrate, wherein the secondary sealing ring 206 is connected with a well pad 207 used for measurement.

According to the structure shown in FIG. 20, it is possible to stabilize the well potential of the monitoring element 203, which is thus improved in measurement decision.

In addition, the aforementioned structure is advantageous in that corrosion and roughness of etched surfaces due to processing of scribing lines are difficult to occur after dry etching and wet etching thereafter.

Figure 21:
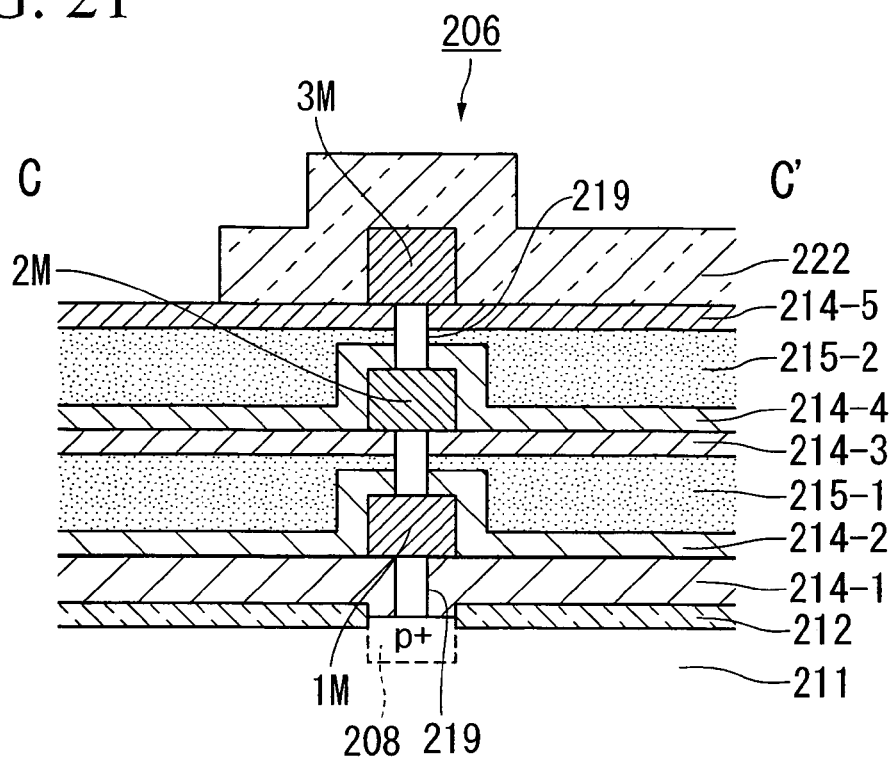
FIG. 21 is a cross-sectional view taken along line C–C' in FIG. 20, which shows essential parts with respect to a secondary seal ring used for the protection of the monitoring element.

FIG. 21 is a cross-sectional view taken along line C–C' in FIG. 20, which shows essential parts with respect to the secondary seal ring 206 used for the protection of the monitoring element 203. The basic structure regarding the secondary seal ring 206 shown in FIG. 21 is similar to that shown in FIG. 18; hence, the detailed description thereof will be omitted. Compared with the structure shown in FIG. 18, the structure shown in FIG. 21 is characterized in that the secondary seal ring 206 is connected to a p+ well extraction portion 208 in the p well region of the substrate.

Figure 22:
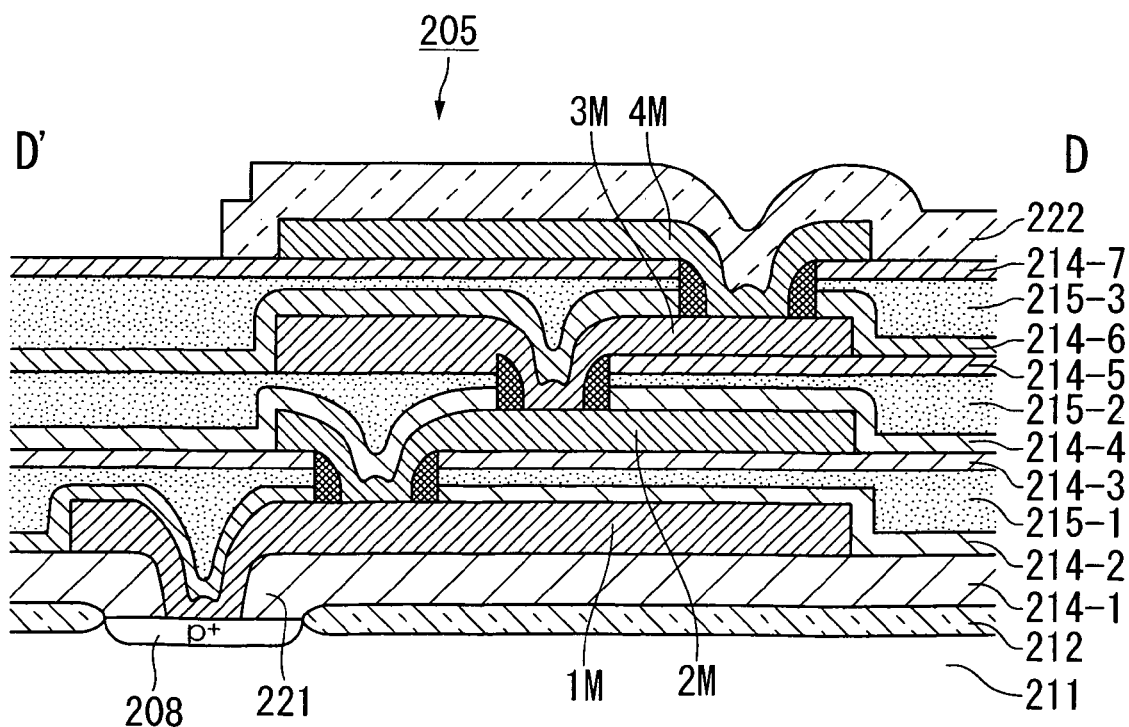
FIG. 22 is a cross-sectional view taken along line D–D' in FIG. 20, which shows essential parts with respect to a seal ring used for the formation of an IC region.

FIG. 22 is a cross-sectional view taken along line D–D' in FIG. 20, which shows essential parts with respect to a seal ring 205 used for the formation of the IC region 201. The basic structure regarding the seal ring 205 shown in FIG. 22 is similar to that shown in FIG. 19; hence, the detailed description thereof will be omitted. Compared with the structure shown in FIG. 19, the structure shown in FIG. 22 is characterized in that the seal ring 205 is connected onto the p+well extraction portion 208 of the substrate.

The manufacturing method for the secondary seal ring 206 shown in FIG. 21 according to the first modified example is similar to the manufacturing method for the secondary seal ring 206 shown in FIG. 18; hence, the detailed description thereof will be omitted.

Figure 23:
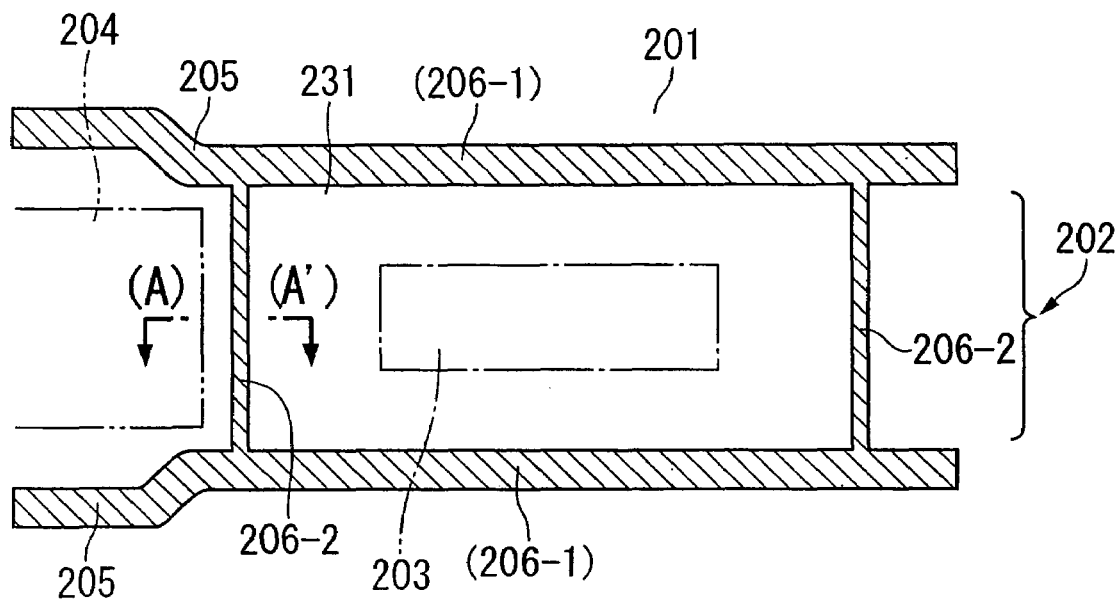
FIG. 23 is a plan view showing the layout for arranging a monitoring element in a scribing line on a semiconductor substrate in accordance with a second modified example of the third embodiment of the invention.

Next, FIG. 23 is a plan view showing the layout for arranging a monitoring element in a scribing line on the surface of a semiconductor substrate in accordance with a second modified example of the third embodiment.

In this example, secondary seal rings 206-1 and 206-2 share functions of the seal rings 205 used for the formation of an IC region and are basically formed in the same structure of the seal rings 205, wherein the secondary seal rings 206-1 are continuously formed together with the seal rings 205, whereas the other secondary seal rings 206-2 are formed independently of the seal rings 205 because they are used for the protection of the monitoring element 203. The basic structure of the seal rings 205, 206-1 and 206-2 is similar to that described in conjunction with the third embodiment and its first modified example; hence, the detailed description thereof will be omitted.

The second modified example of FIG. 23 is characterized in that the seal rings 205, 206-1, and 206-2 share the same function and basically have the same structure, wherein it is possible to noticeably reduce the overall area regarding the seal rings, which contribute to the comprehensive or partial reduction of the width of the scribing line.

Figure 24:
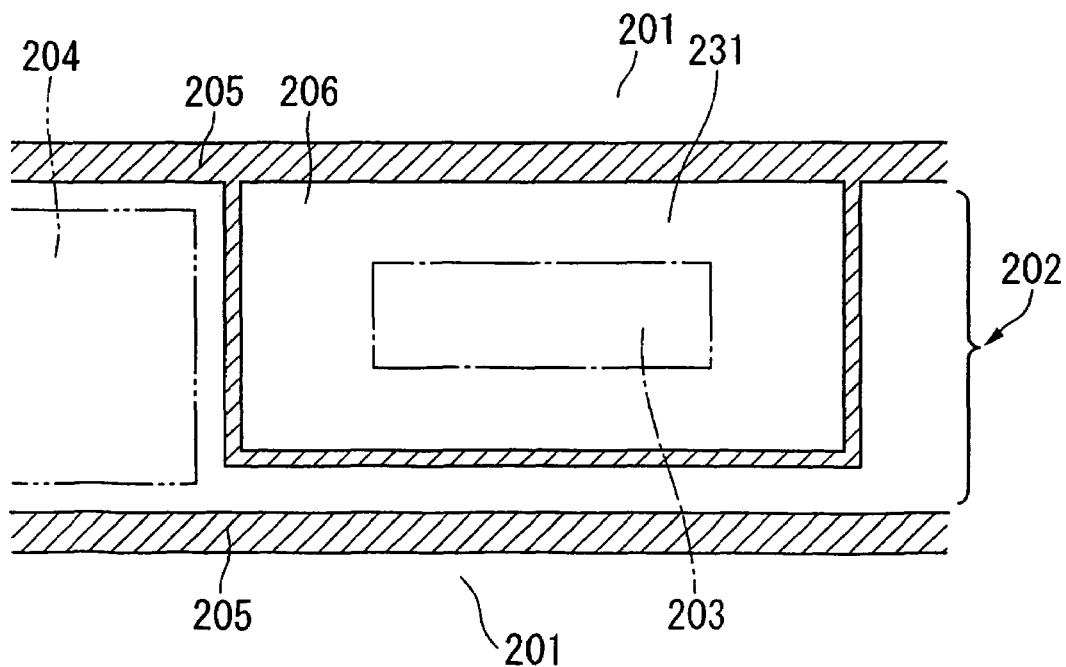
FIG. 24 is a plan view showing the layout for arranging a monitoring element in a scribing line on a semiconductor substrate in accordance with a third modified example of the third embodiment of the invention.

Next, FIG. 24 is a plan view showing the layout for arranging a monitoring element in a scribing line the surface on a semiconductor substrate in accordance with a third modified example of the third embodiment.

Compared with the semiconductor substrate shown in FIG. 23, the semiconductor substrate shown in FIG. 24 is characterized in that the monitoring element 203 is not formed in the center area of the scribing line 202 but is slightly shifted in position within the scribing line 202; specifically, in FIG. 24, the monitoring element 203 is shifted upwardly in the scribing line 202. This reliably avoids the occurrence of cracking. Other structural points of the third modified example are similar to those of the third embodiment and its first and second modified examples described above; hence, the detailed description thereof will be omitted.

Figure 25:
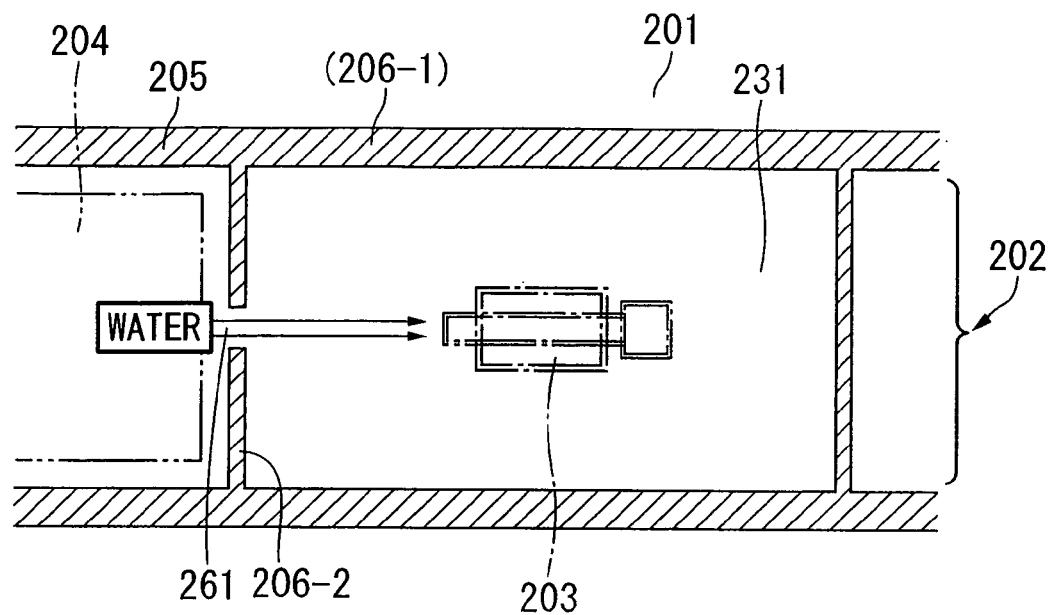
FIG. 25 is a plan view showing the layout for arranging a monitoring element in a scribing line on a semiconductor substrate in accordance with a fourth modified example of the third embodiment of the invention.
Figure 26:
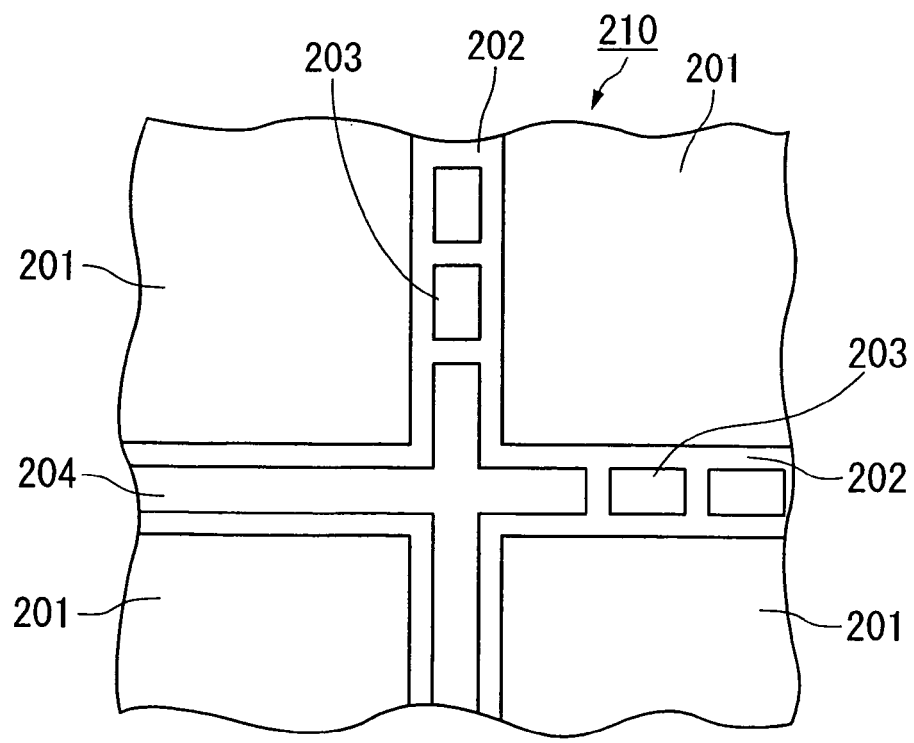
FIG. 26 is a plan view showing the layout for arranging monitoring elements in scribing lines on the surface of a semiconductor substrate on which a plurality of IC regions are formed.
Figure 27:
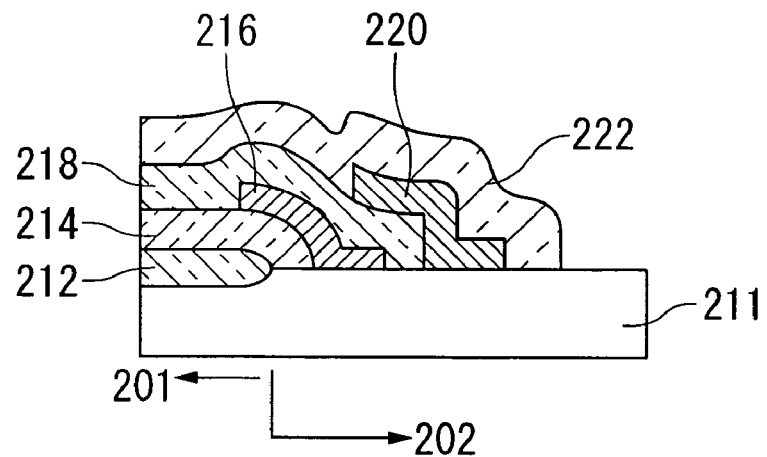
FIG. 27 is a cross-sectional view showing a seal ring structure adapted to the IC region.
Figure 28:
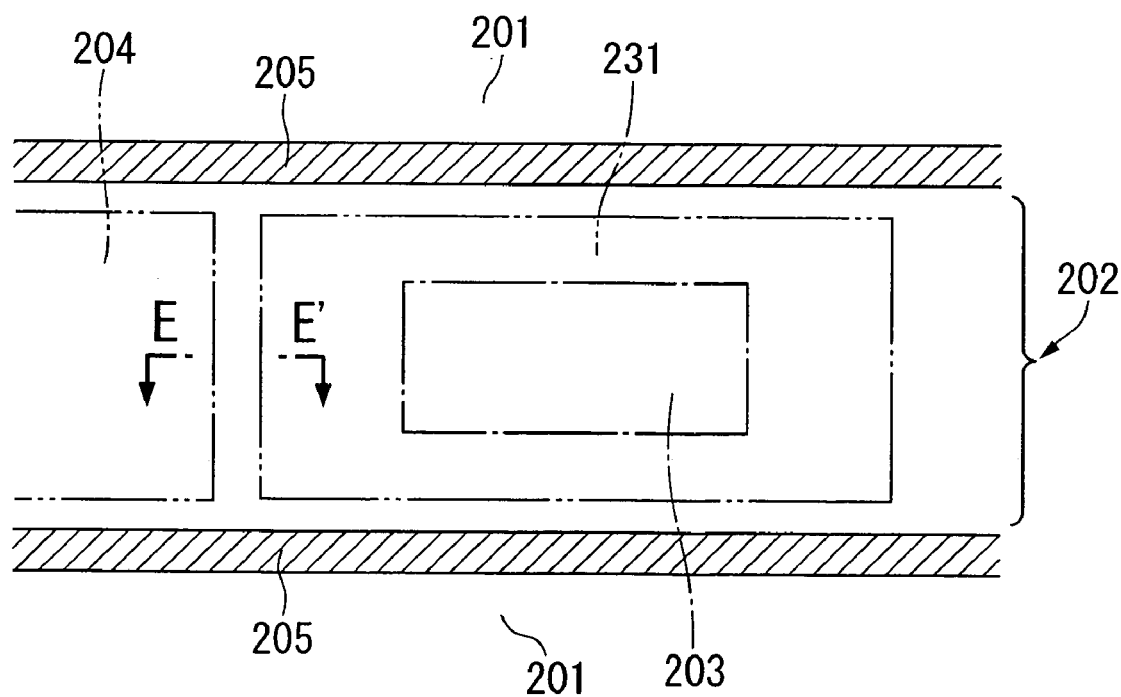
FIG. 28 is an enlarged plan view showing a monitoring element formed in a monitoring element region in a scribing line.
Figure 29:
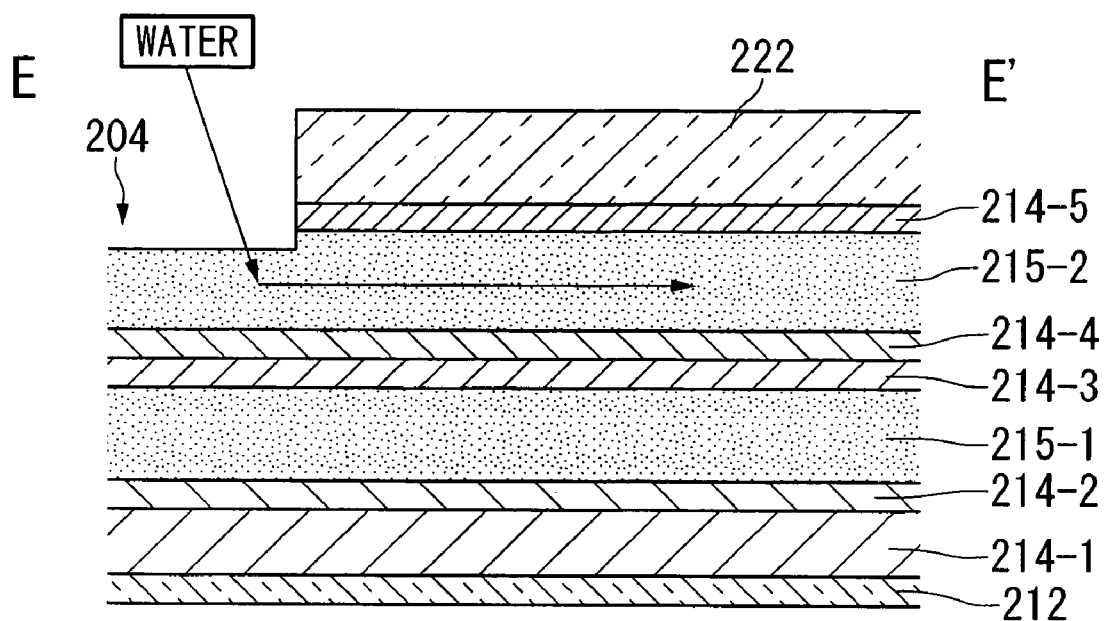
FIG. 29 is a cross-sectional view taken along line E–E' in FIG. 28.

Next, FIG. 25 is a plan view showing the layout for arranging a monitoring element in a scribing line on the surface of a semiconductor substrate in accordance with a fourth modified example of the third embodiment.

This example is characterized in that a part of the secondary seal ring 206-2, which is formed between the passivation opening 204 and the monitoring element region 231 so as to encompass the monitoring element region 231, is removed to form a seal opening 261.

In the aforementioned structure having no via hole for blocking water in the seal opening 261, there is a possibility that water, which exists in the passivation opening 204, may infiltrate into the monitoring element region 231 through SOG films (not shown). By monitoring variations of characteristics of the monitoring element 203, it is possible to estimate the diffusion velocity of water into interlayer films (not shown) of the monitoring element region 231, which can be applied to simulation regarding the evaluation of resistances of elements incorporated in integrated circuits and the occurrence of defectiveness of integrated circuits, for example.

As this invention may be embodied in several forms without departing from the spirit or essential characteristics thereof, the aforementioned embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A semiconductor substrate that is partitioned along scribing lines so as to form a plurality of IC regions encompassed by seal rings, wherein a passivation opening is formed in the scribing line in which a monitoring element is formed within a monitoring element region, which is encompassed by secondary seal rings.

2. A semiconductor substrate according to claim 1, wherein the secondary seal rings are each connected with a silicon substrate.

3. A semiconductor substrate according to claim 1, wherein a part of the secondary seal rings share the same functions of the seal rings used for formation of the IC regions.

4. A semiconductor substrate according to claim 1, wherein a part of the secondary seal ring, which lies between the monitoring element region and the passivation opening in the scribing line, is removed.

5. A semiconductor substrate according to claim 1, wherein a width of the seal ring is greater than a width of the secondary seal ring.

6. A semiconductor substrate according to claim 1, wherein the seal ring has a laminated structure having a plurality of metal layers, which are laminated together via an insulating layer and are mutually connected together via a contact hole.

7. A semiconductor substrate according to claim 1, wherein the secondary seal ring has a laminated structure having a plurality of metal layers, which are laminated together via an insulating layer and are mutually insulated from each other by way of a via hole.

8. A semiconductor substrate comprising:
scribing lines that partition the semiconductor substrate to form a plurality of IC regions;
first seal rings that encompass each of the IC regions:
at least one passivation opening in the scribing line;
a monitoring element formed within a monitoring element region of the passivation opening; and
secondary seal rings, which encompass the monitoring element.

* * * * *

UNITED STATES PATENT AND TRADEMARK OFFICE
CERTIFICATE OF CORRECTION

| | |
|---|---|
| PATENT NO. | : 7,193,296 B2 |
| APPLICATION NO. | : 11/039956 |
| DATED | : March 20, 2007 |
| INVENTOR(S) | : Hiroshi Naito et al. |

It is certified that error appears in the above-identified patent and that said Letters Patent is hereby corrected as shown below:

*Column 5, Line 30, should read:

surface of a silicon substrate 211 and are each constituted by

Column 17, Line 35, should read:

interlayer insulating films 215-1 and 215-2 therebetween.

Signed and Sealed this

Twenty-second Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 7,193,296 B2 Page 1 of 1
APPLICATION NO. : 11/039956
DATED : March 20, 2007
INVENTOR(S) : Harumitsu Fujita It is certified that error appears in the above-identified patent and that said Letters Patent is hereby corrected as shown below:

*Column 5, Line 30, should read:

surface of a silicon substrate 211 and are each constituted by

Column 17, Line 35, should read:

interlayer insulating films 215-1 and 215-2 therebetween.

This certificate supersedes Certificate of Correction issued May 22, 2007.

Signed and Sealed this

Twenty-first Day of August, 2007

JON W. DUDAS
*Director of the United States Patent and Trademark Office*